(12) United States Patent
Takeuchi

(10) Patent No.: US 7,427,936 B2
(45) Date of Patent: Sep. 23, 2008

(54) A/D CONVERTER DEVICE AND ELECTRONIC CONTROL APPARATUS INCLUDING SAME

(75) Inventor: Yoshiharu Takeuchi, Kariya (JP)

(73) Assignee: Denso Corporation (JP)

( * ) Notice: Subject to any disclaimer, the term of this patent is extended or adjusted under 35 U.S.C. 154(b) by 0 days.

(21) Appl. No.: 11/790,139

(22) Filed: Apr. 24, 2007

(65) Prior Publication Data

US 2007/0252744 A1 Nov. 1, 2007

(30) Foreign Application Priority Data

May 1, 2006 (JP) ............................. 2006-127567

(51) Int. Cl.
*H03M 1/10* (2006.01)
(52) U.S. Cl. ...................... 341/120; 341/118; 341/122; 341/155
(58) Field of Classification Search ................. 341/118, 341/120, 122, 155
See application file for complete search history.

(56) References Cited

U.S. PATENT DOCUMENTS

| | | | |
|---|---|---|---|
| 5,207,200 A | | 5/1993 | Iwata |
| 6,092,015 A | * | 7/2000 | Takahashi et al. ........... 701/101 |
| 6,163,291 A | * | 12/2000 | Uchino et al. ............... 341/163 |
| 6,177,899 B1 | * | 1/2001 | Hsu ........................... 341/156 |
| 6,933,867 B2 | * | 8/2005 | Honda ........................ 341/118 |
| 6,977,600 B2 | * | 12/2005 | Jiang et al. .................. 341/136 |
| 7,009,537 B2 | * | 3/2006 | Kabune ....................... 341/120 |
| 7,102,559 B2 | * | 9/2006 | Van Tuijl .................... 341/156 |
| 7,215,274 B2 | * | 5/2007 | Liu ............................ 341/156 |
| 7,310,575 B2 | * | 12/2007 | Honda ........................ 701/111 |

FOREIGN PATENT DOCUMENTS

| | | |
|---|---|---|
| GB | 2 317 969 | 4/1998 |
| JP | 63-208326 | 8/1988 |
| JP | 05-026090 | 2/1993 |
| JP | 08-330959 | 12/1996 |
| JP | 10-115247 | 5/1998 |
| JP | 11-050941 | 2/1999 |
| JP | 2001-244813 | 9/2001 |
| JP | 2005-184118 | 7/2005 |

* cited by examiner

*Primary Examiner*—Linh V Nguyen
(74) *Attorney, Agent, or Firm*—Nixon & Vanderhye PC

(57) ABSTRACT

The A/D converter device includes a comparing section and an abnormality judging section. The comparing section compares a voltage of its signal transfer line connected between its input multiplexer and its A/D converting section through its sample-hold section with a predetermined abnormality judging voltage. The abnormality judging section is configured to apply a reference voltage to the signal transfer line in synchronization with an A/D conversion cycle thereof on condition that its A/D converting operation thereof is not interrupted, and to determine presence of abnormality in the A/D converter device if an comparison result of the comparing section does not match an expected value corresponding to the reference voltage.

19 Claims, 13 Drawing Sheets

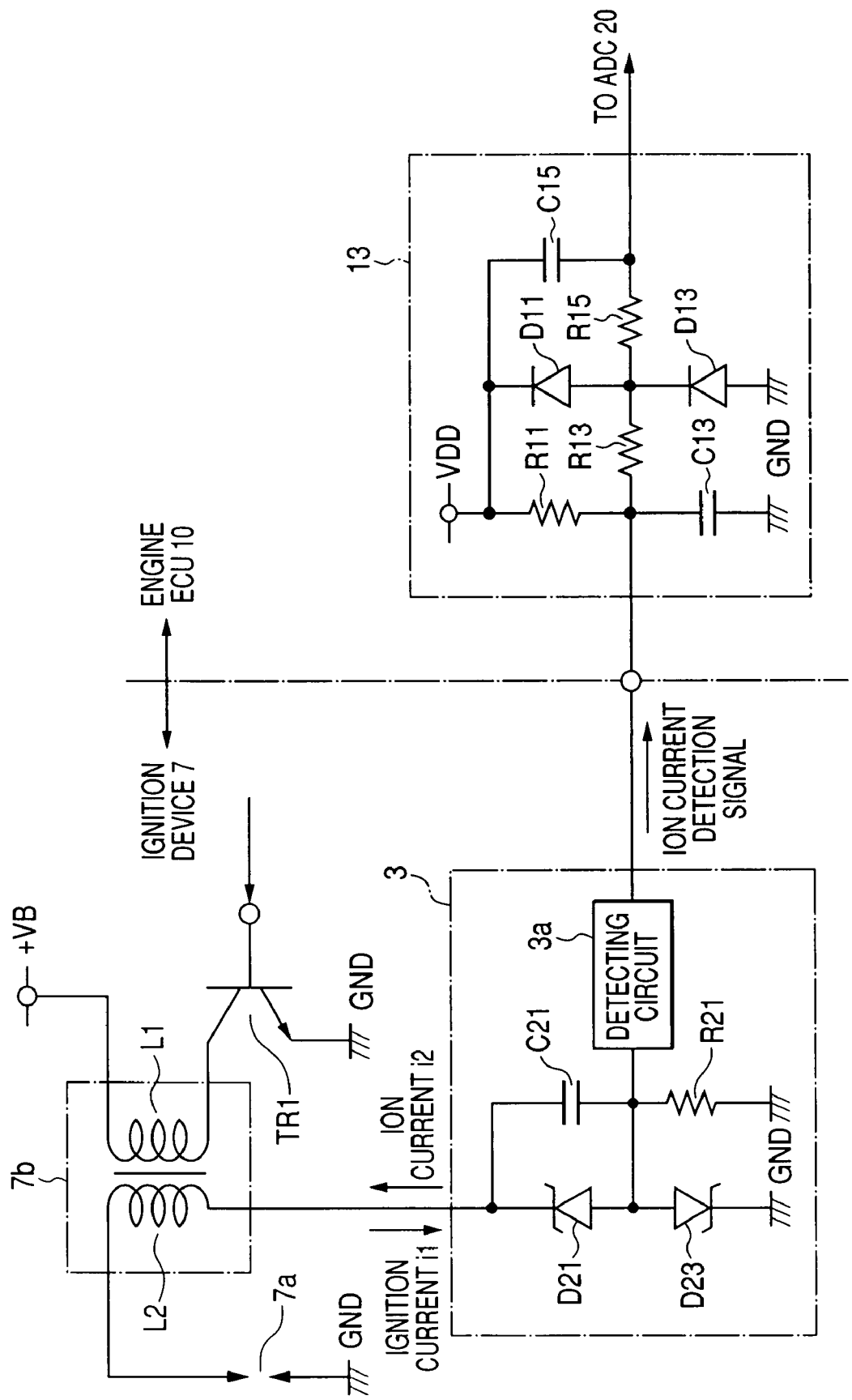

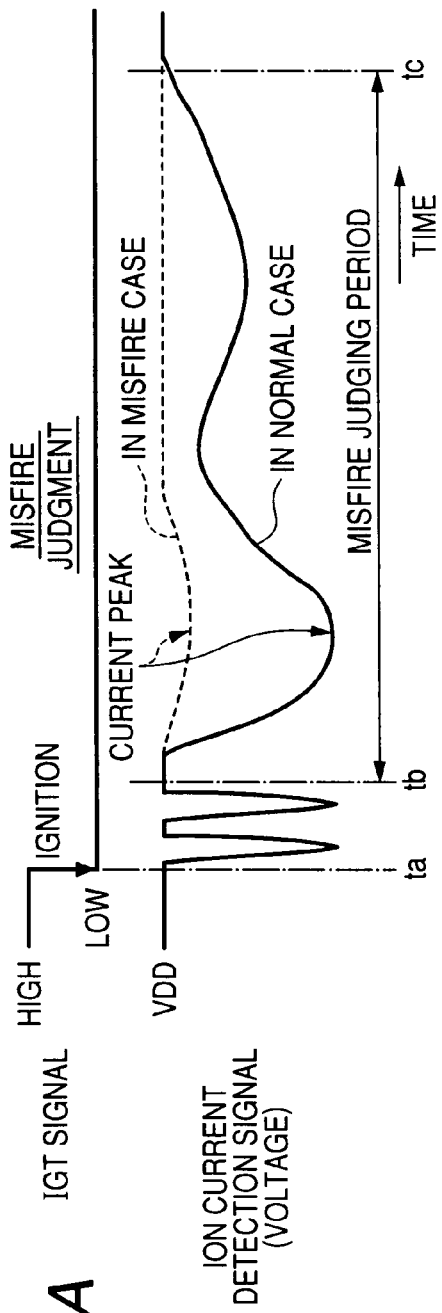
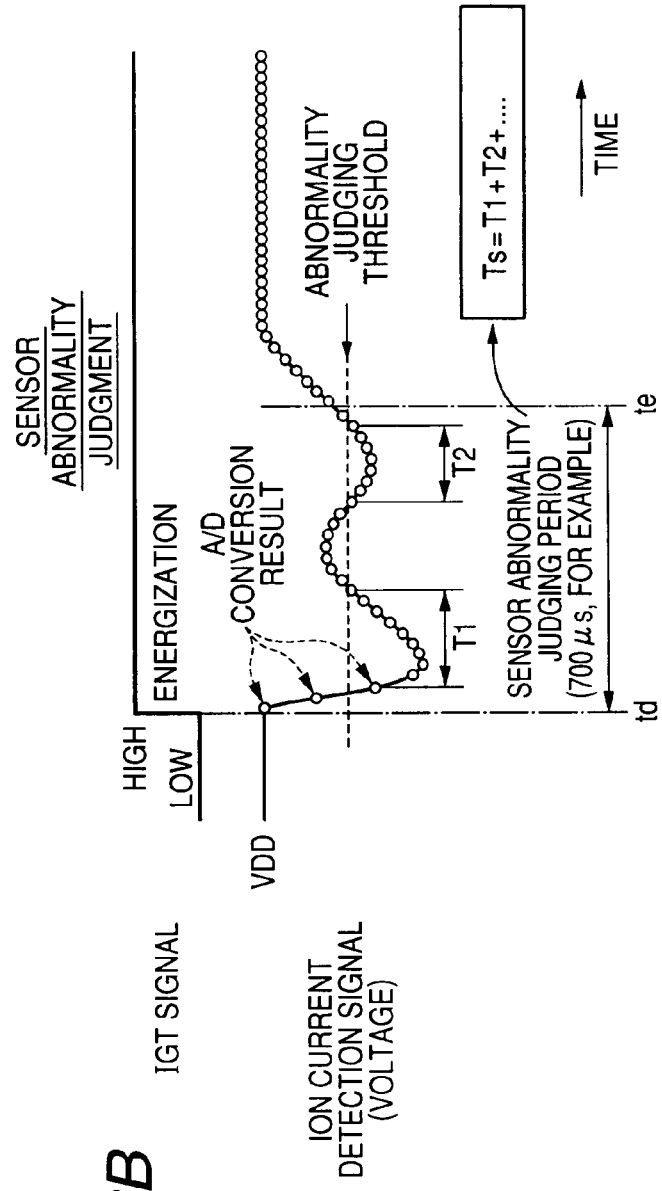
FIG. 6A
FIG. 6B

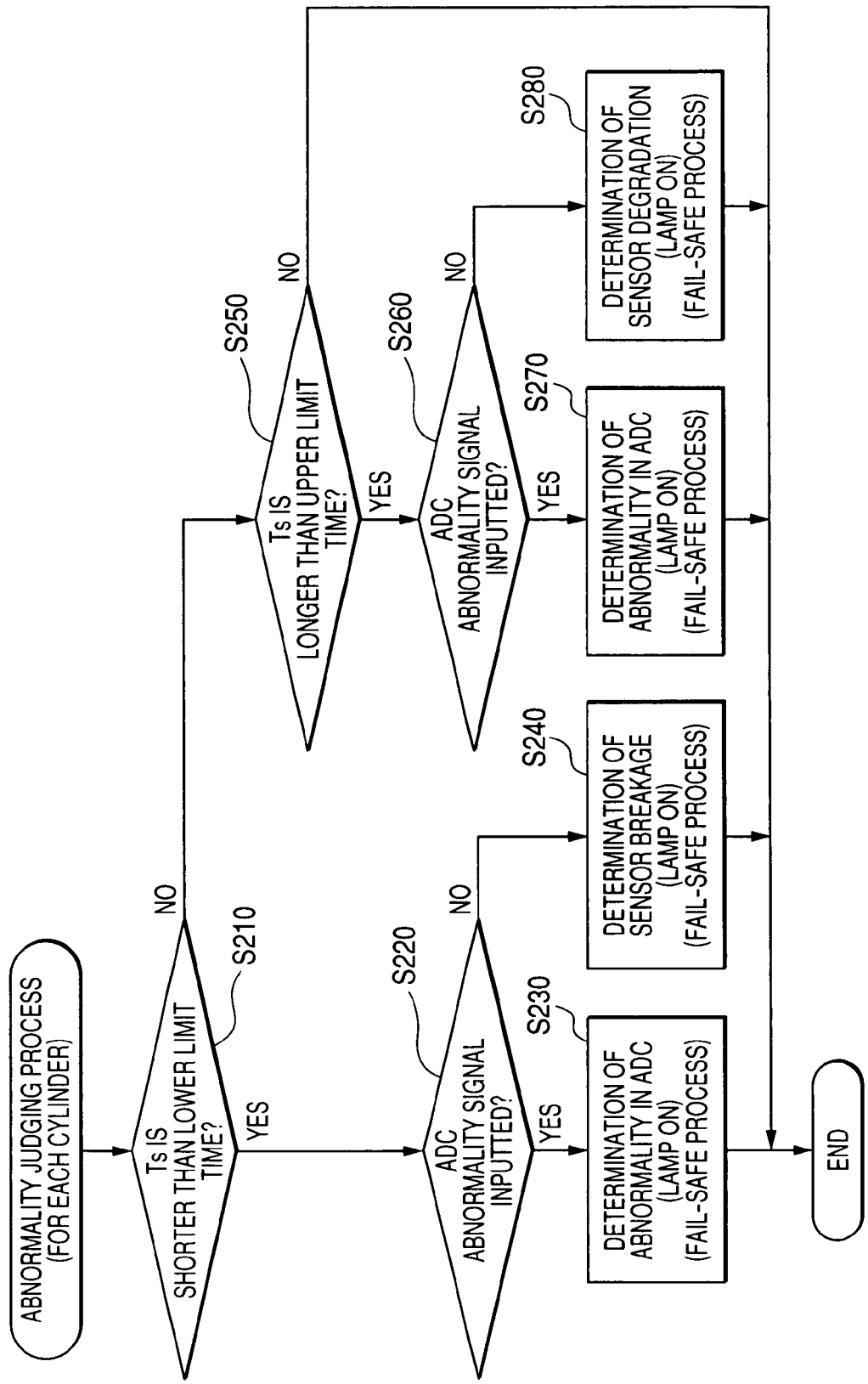

A/D CONVERTER DEVICE AND ELECTRONIC CONTROL APPARATUS INCLUDING SAME

CROSS-REFERENCE TO RELATED APPLICATION

This application is related to Japanese Patent Application No. 2006-127567 filed on May 1, 2006, the contents of which are hereby incorporated by reference.

BACKGROUND OF THE INVENTION

1. Field of the Invention

The present invention relates to an A/D converter device configured to take in a selected one of plurality of input signals through a multiplexer and converts it into a digital signal, and relates to an electronic control apparatus including such an A/D converter device.

2. Description of Related Art

Generally, an A/D converter device provided with a multiplexer for selectively taking in one of a plurality of input signals is configured to be supplied with a reference voltage such as a power supply voltage or a ground voltage, and to judge whether or not the A/D converter device (more specifically, the multiplexer or its A/D converting section) is functioning normally by detecting whether or not an A/D conversion result outputted from its A/D converting section coincides with an expected value corresponding to the reference value. For example, refer to Japanese Patent Application Laid-open No. 8-330959, or No. 10-115247.

However, such a conventional A/D converter device has a problem in that since it has to A/D-convert the reference voltage to judge whether or not there exists abnormality therein, it is difficult to assure a required control response in a case where it is used for an electronic control apparatus required to have a capability of sequentially A/D-converting input signals (sensor signals) at high speed, which are outputted from an engine control device and various sensors, because performing A/D conversion on the reference voltage delays A/D conversions on these input signals. It may occur that the above described problem can be solved if the A/D converter device is configured so as to make an abnormality judgment only once immediately after the electronic control apparatus in which the A/D converter device is included is powered on, or make am abnormality judgment only during a time period in which A/D conversions on the sensor signals are not required to be performed at high speed (for example, when a vehicle engine is running at low speed), or make an abnormality judgment only each time A/D conversions have been performed for a predetermined number of the input signals.

However, if the intervals at which the A/D conversion for making the abnormality judgment is performed is made longer than the intervals at which the A/D conversion on the sensor signals are performed, there arises another problem that when an abnormality occurs, the A/D converter device cannot detect it immediately, as a result of which the electronic control apparatus can control the control objects thereof in accordance with erroneous A/D conversion results.

SUMMARY OF THE INVENTION

The present invention provides an A/D converter device comprising:

a plurality of input lines connected, through a pull-up resistor or a pull-down resistor, to a first power supply line selected from a positive-side power supply line connected to a positive side of a DC power source and a negative-side power supply line connected to a negative side of the DC power source;

a multiplexer having an input signal selection switch device for selecting, as an A/D conversion object, one of sensor signals outputted from external sensors each of which is connected to a corresponding one of the input lines, and delivering the A/D conversion object to a signal transfer line connected to the multiplexer;

a sample-hold section connected to the signal transfer line through an input switch device to hold therein the A/D conversion object;

an A/D converting section A/D converting the A/D conversion object held in the sample-hold section into digital data representing a signal level of the A/D conversion object;

an initialization switch device being turned on to connect a connection node between the input switch device and the sample-hold section to the first power supply line to initialize the sample-hold section; and an A/D conversion control section controlling the multiplexer such that the sensor signals are successively taken in as the A/D conversion object in a predetermined A/D conversion cycle, and alternately turning on and off the initialization switch device and the input switch device in synchronization with the A/D conversion cycle in order that initialization of the sample-hold section, sampling operation by the sample-hold section, and A/D converting operation by the A/D converting section are performed successively;

wherein the multiplexer is provided with a reference-voltage-selection switch device being turned on to apply reference voltage to the signal transfer line, and wherein the A/D converter device further comprises a comparing section comparing a voltage of the signal transfer line with a predetermined abnormality judging voltage, and an abnormality judging section configured to turn on the reference-voltage-selection switch device in order to apply the reference voltage to the signal transfer line in synchronization with the A/D conversion cycle on condition that the A/D converting operation by the A/D converting section is not interrupted, and to determine presence of abnormality in the A/D converter device if an comparison result of the comparing section does not match an expected value corresponding to the reference voltage when the reference-voltage-selection switch device is turned on.

The present invention further provides an electronic control apparatus for controlling control objects on the basis of sensor signals received from external sensors, comprising:

an A/D converter device including;

a plurality of input lines connected, through a pull-up resistor or a pull-down resistor, to a first power supply line selected from a positive-side power supply line connected to a positive side of a DC power source and a negative-side power supply line connected to a negative side of the DC power source, a multiplexer having an input signal selection switch device for selecting, as an A/D conversion object, one of sensor signals outputted from the external sensors each of which is connected to a corresponding one of the input lines, and delivering the A/D conversion object to a signal transfer line connected to the multiplexer, a sample-hold section connected to the signal transfer line through an input switch device to hold therein the A/D conversion object, an A/D converting section A/D converting the A/D conversion object held in the sample-hold section into digital data representing a signal level of the A/D conversion object, an initialization switch device being turned on to connect a connection node between the input switch device and the sample-hold section to the first power supply line to initialize the sample-hold section, and an A/D conversion control section controlling the multiplexer such that the sensor signals are successively taken in as the A/D conversion object in a predetermined A/D conversion cycle, and alternately turning on and off the initialization switch device and the input switch device in synchronization with the A/D conversion cycle in order that initialization of the sample-hold section, sampling operation by the sample-hold section, and A/D converting operation by the A/D converting section are performed successively, the multiplexer being provided with a reference-voltage-selection switch device being turned on to apply reference voltage to the signal transfer line, and the A/D converter device further comprising a comparing section comparing a voltage of the signal transfer line with a predetermined abnormality judging voltage, and an abnormality judging section configured to turn on the reference-voltage-selection switch device in order to apply the reference voltage to the signal transfer line in synchronization with the A/D conversion cycle on condition that the A/D converting operation by the A/D converting section is not interrupted, and to determine presence of abnormality in the A/D converter device if an comparison result of the comparing section does not match an expected value corresponding to the reference voltage when the reference-voltage-selection switch device is turned on;

an A/D conversion result judging section making a judgment as to whether or not the digital data received from the A/D converter device as an A/D conversion result is normal;

a device state judging section making a judgment as to whether or not the abnormality judging section of the A/D converter device determines presence of abnormality in the A/D converter device; and an abnormality content distinguishing section distinguishing between abnormality in the A/D converter device and abnormality in one of the external sensors on the basis of the judgment made by the A/D conversion result judging section and the judgment made by the device state judging section.

According to the present invention, an A/D converter device capable of performing self-diagnosis operation without suspending or delaying its A/D converting operation can be provided. Furthermore, according to the present invention, an electronic control apparatus capable of judging whether an A/D conversion result received from such an A/D converter device is abnormal, or the A/D conversion result is normal but there is abnormality in this A/D converter device, or there is abnormality in an external sensor connected to this A/D converter device.

Other advantages and features of the invention will become apparent from the following description including the drawings and claims.

BRIEF DESCRIPTION OF THE DRAWINGS

In the accompanying drawings:

FIG. 5 is a diagram showing a circuit structure of an ion current detecting device, and an input circuit included in the engine ECU shown in FIG. 1 receiving an ion current detection signal outputted from the ion current detecting device;

FIG. 6A is a time chart for explaining a misfire judging process performed by use of the ion current detecting device shown in FIG. 5;

FIG. 6B is a time chart for explaining a sensor abnormality judging process performed by use of the ion current detecting device shown in FIG. 5;

FIG. 7 is a flowchart showing an abnormality judging process performed by a CPU included in the engine ECU shown in FIG. 1;

PREFERRED EMBODIMENTS OF THE INVENTION

First Embodiment

Figure 1:
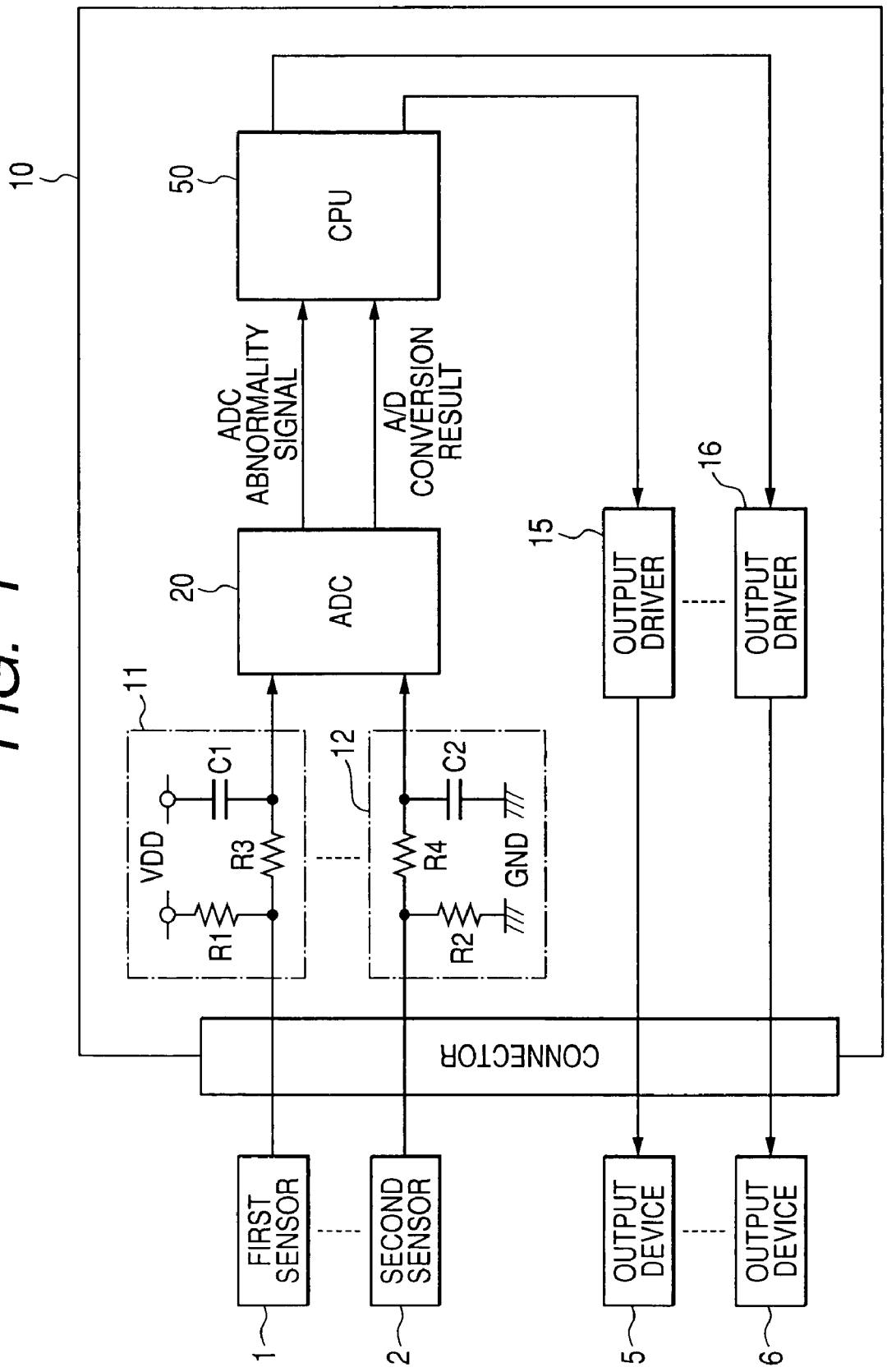
FIG. 1 is a block diagram showing a schematic structure of an engine ECU (Electronic Control Unit) including an A/D converter device according to a first embodiment of the invention.

FIG. 1 is a block diagram showing a schematic structure of an engine ECU (Electronic Control Unit) 10 including an A/D converter device 20 according to a first embodiment of the invention.

The engine ECU 10, which is an electronic control apparatus for controlling a fuel injection amount, an ignition timing of an internal combustion engine (gasoline engine in this embodiment), etc., has a self-diagnosis function to detect misfire in each cylinder of the internal combustion engine etc. Accordingly, many sensors detecting various running states of the engine (rotational speed, intake air pipe pressure, throttle opening degree, cooling water temperature, misfire, etc.) are connected to the engine ECU 10. Of these sensors, those outputting an analog sensor signal are connected to the A/D converter device 20 through a first input circuit 11 or a second input circuit 12, respectively.

The first input circuit 11 is for taking in a sensor signal outputted from a first sensor 1 by connecting, through a pull-up resistor R1, an input line of the first sensor to a power supply line at a power supply voltage of VDD connected to a positive side of a DC power supply source (not shown). The second input circuit 12 is for taking in a sensor signal outputted from a second sensor 2 by connecting, through a pull-down resistor R2, an input line of the second sensor to a ground line at a ground voltage of GND connected to a negative side of the DC power supply source.

The first input circuit 11 includes a noise removing filter constituted by a resistor R3 and a capacitor C1. The second input circuit 12 is provided with a noise removing filter constituted by a resistor R4 and a capacitor C2. It should be noted that the first sensor 1 is only one of the sensors connected to engine ECU 10 through the first input circuit 11, and the second sensor 2 is only one of the sensors connected to engine ECU 10 through the second input circuit 12.

The A/D converter device 20 operates to successively A/D-convert the sensor signals received from these sensors through the first input circuit 11 or the second input circuit 12 in a predetermined A/D conversion cycle. The A/D conversion result of the A/D converter device 20 is supplied to an engine control microcomputer (referred to as CPU hereinafter) 50 including a CPU, a ROM, a RAM, etc. for engine control The A/D converter device 20 has a self-diagnosis function for detecting its own abnormality while successively A/D-converting the sensor signals. If the A/D converter device 20 detects an abnormality in itself, it informs the CPU 50 of this by an ADC abnormality signal outputted to the CPU 50.

The CPU 50 executes various processes concerning engine control, misfire detection, etc in accordance with control programs stored in the ROM. More specifically, the CPU 50 takes in the A/D conversion results of the sensor signals outputted from the A/D converter device 20, and sensor signals (pulse signals or on/off signals) outputted from other sensors and switches not connected to the A/D converter device 20, executes various processes concerning engine control, misfire detection, etc., on the basis of the A/D conversion results and the sensor signals, and outputs control signals depending on execution results to various output drivers 15, 16 in order to control various output devices 5, 6 such as fuel injectors, igniters, and alarm lamps through the output drivers 15, 16. Since control processes on such output devices are well known, further explanation is omitted here.

Next, a structure and an operation of the A/D converter device are explained. In the below explanation, it is assumed that only the first sensor 1 and the second sensor 2 are connected to the A/D converter device 20 to facilitate the explanation and understanding of the operation of the A/D converter device 20

Figure 2:
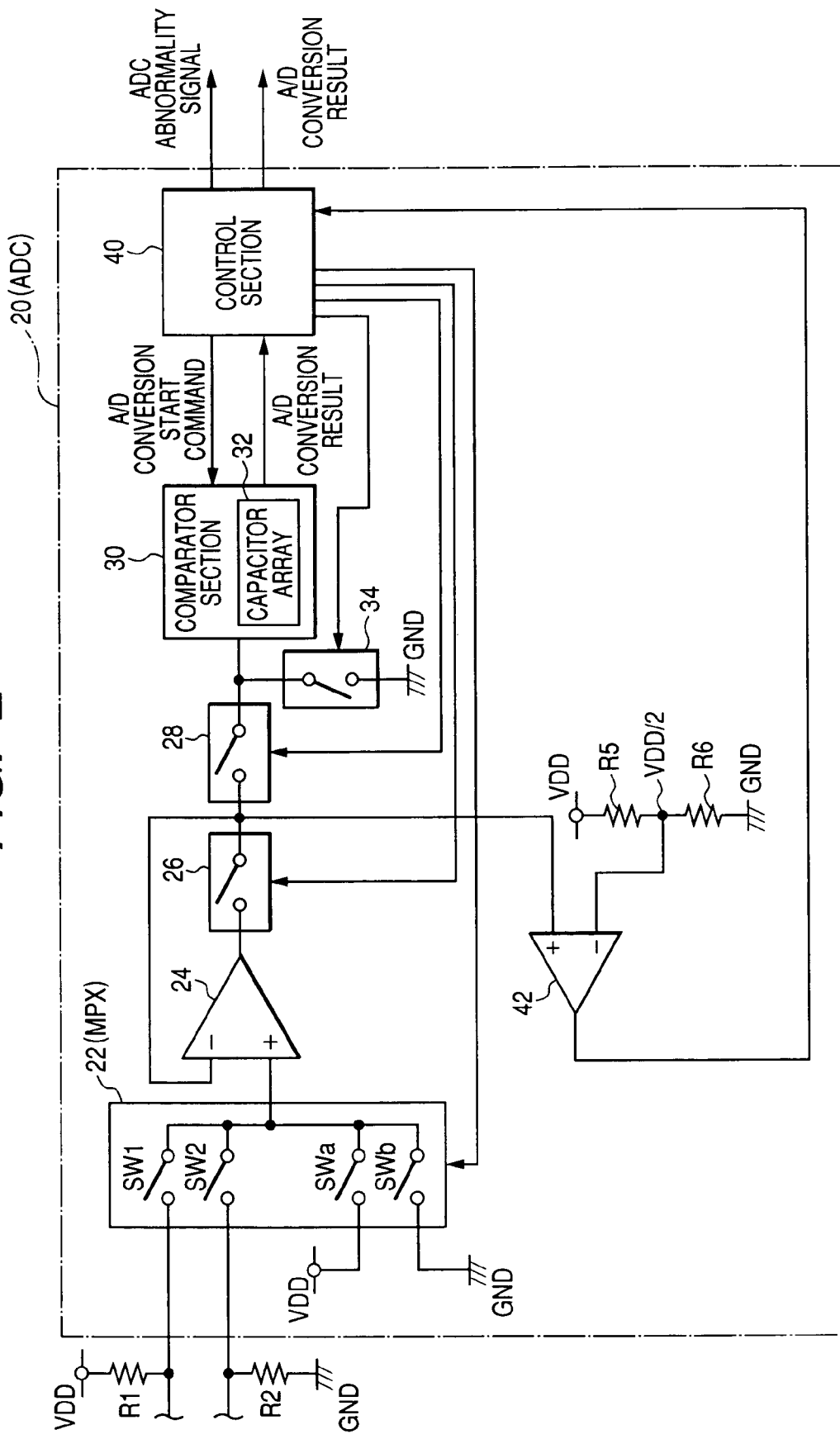
FIG. 2 is a diagram showing a structure of the A/D converter device shown in FIG. 1.

As shown in FIG. 2, the A/D converter device 20 includes a multiplexer 22 operating to selectively take in one of the sensor signal outputted from the first sensor 1 and the sensor signal outputted from the second sensor 2, a sampling amplifier (a buffer circuit constituted by an operational amplifier) 24 operating to amplify the sensor signal received from the multiplexer 22 while keeping its signal level, a comparator section 30 operating to convert the sensor signal outputted from the sampling amplifier 24 into digital data formed by a predetermined number of bits and representing the signal level of the sensor signal, and a control section 40 controlling the comparator section 30 and below described various switches to successively A/D-converts the sensor signals outputted from the first sensor 1 and the second sensor 2.

A series of two input switches 26, 28 are disposed on a signal transfer line between the sampling amplifier 24 and the comparator section 30. The comparator section 30 is provided with a capacitor array 32. The capacitor array 32 is charged by the sensor signal when the input switches 26, 28 are placed in the on state by the control section 40 to hold a sample of the sensor signal therein.

The comparator section 30 converts the sample of the sensor signal into digital data representing the signal level of this sample by performing comparisons between the signal level of this sample and a plurality of reference voltages.

In the below explanation, for distinction between the input switch 26 on the side of the sampling amplifier 24 and the input switch 28 on the side of the comparator section 30, the input switch 26 is referred to as a sampling switch, and the input switch 28 is referred to as an ADC switch.

A connection node between the comparator section 30 (to be exact, the capacitor array 32) and the signal transfer line is connected to one terminal of an initialization switch 34 which is connected to the ground line at the other terminal thereof. The control section 40 initializes the comparator section 30 by turning on the initialization switch 34 for a predetermined initialization time before turning on the sampling switch 26 and the ADC switch 28 to input the sensor signal to the comparator section 30.

The control section 40, which is constituted by a logic circuit operating on a reference clock supplied from a reference clock source (not shown), counts this reference clock to repeatedly measure the period of the A/D conversion cycle between two adjacent A/D conversion start timings t1, and alternately turns on a first input signal selection switch SW1 and a second input signal selection switch SW2 in synchronization with the A/D conversion cycle in order to alternately A/D-convert the sensor signal outputted from the first sensor 1 and the sensor signal outputted from the second sensor 2.

The A/D conversion cycle is divided into an initializing period starting from the A/D conversion start timing t1 and ending at an initialization end timing t2, a sampling period starting from the initialization end timing t2 and ending at a sampling end timing t3, and a comparing period starting from the sampling end timing t3 to the next A/D conversion start timing t1. The control section 40 turns off the sampling switch 26, and turns on the ADC switch 28 and the initialization switch 34 during the initializing period in order to ground an input line between the ADC switch 28 and the comparator section 30 to the ground line, while preventing the sensor signal from entering the comparator section 30. Accordingly, during the initializing period, the charge accumulated in the capacitor array 32 is discharged, and the connection node between the comparator section 30 and the signal transfer line is initialized to the ground voltage (0V).

In the sampling period, the control section 40 changes the initialization switch 34 from the on state to the off state, and changes the sampling switch 26 from the off state to the on state. Accordingly, during the sampling period, the capacitor array 32 is charged to the voltage level of the sensor signal. In the comparing period, the control section 40 changes the ADC switch 28 from the on state to the off state, so that the capacitor array 32 of the comparator section 30 is disconnected from the signal transfer line, and then outputs an A/D conversion start command to the comparator section 30.

During the comparing period, the comparator section 30 converts the sample of the sensor signal held in the capacitor array 32 into digital data, and sends this digital data to the control section 40 as an A/D conversion result. The control section 40 latches this digital data, and supplies it to the CPU 50.

In this embodiment, the control section 40 performs abnormality check processes P1 and P2 (see FIG. 3) during the comparing period in order to make fault diagnosis for the A/D converter device 20 itself. When the abnormality check processes P1, P2 are completed at timing t4, the control section 40 changes the sampling switch 26 from the on state to the off state to prepare for the next initializing operation.

To enable the abnormality check processes P1, P2 to be performed, the multiplexer 22 is provided with, in addition to the first and second input signal selection switches SW1, SW2, a first reference voltage selection switch SWa and a second reference voltage selection switch SWb. The first reference voltage selection switch SWa is for applying a first reference voltage (power supply voltage VDD at the power supply line) to the sampling amplifier 24 through the signal transfer line. The second reference voltage selection switch SWb is for applying a second reference voltage (ground voltage at the ground line) to the sampling amplifier 24 through the signal transfer line.

The A/D converter device 20 further includes a comparator 42 whose non-inverting input terminal is connected to a connection node between the sampling switch 26 and the ADC switch 28, and whose inverting input terminal is connected to a connection node between voltage-dividing resistors R5, R6 connected in series between the power supply line and the ground line for dividing down (by the factor of 2 in this embodiment) the power supply voltage VDD. A divided voltage (VDD/2) at the connection node between the voltage-dividing resistors R5, R6 is applied to the inverting input terminal of the comparator 42 as an abnormality judging voltage.

Accordingly, when the voltage of the signal transfer line between the sampling switch 26 and the ADC switch 28 is higher than the abnormality judging voltage, the comparator 42 outputs a high level signal, and otherwise outputs a low level signal. The output of the comparator 42 is supplied to the control section 40 as an abnormality judging signal, which is used to perform a fault diagnosis for the A/D converter device 20.

Next, the abnormality check process performed by the control section 40 as fault diagnosis is explained with reference to the flowchart of FIG. 4.

Figure 3:
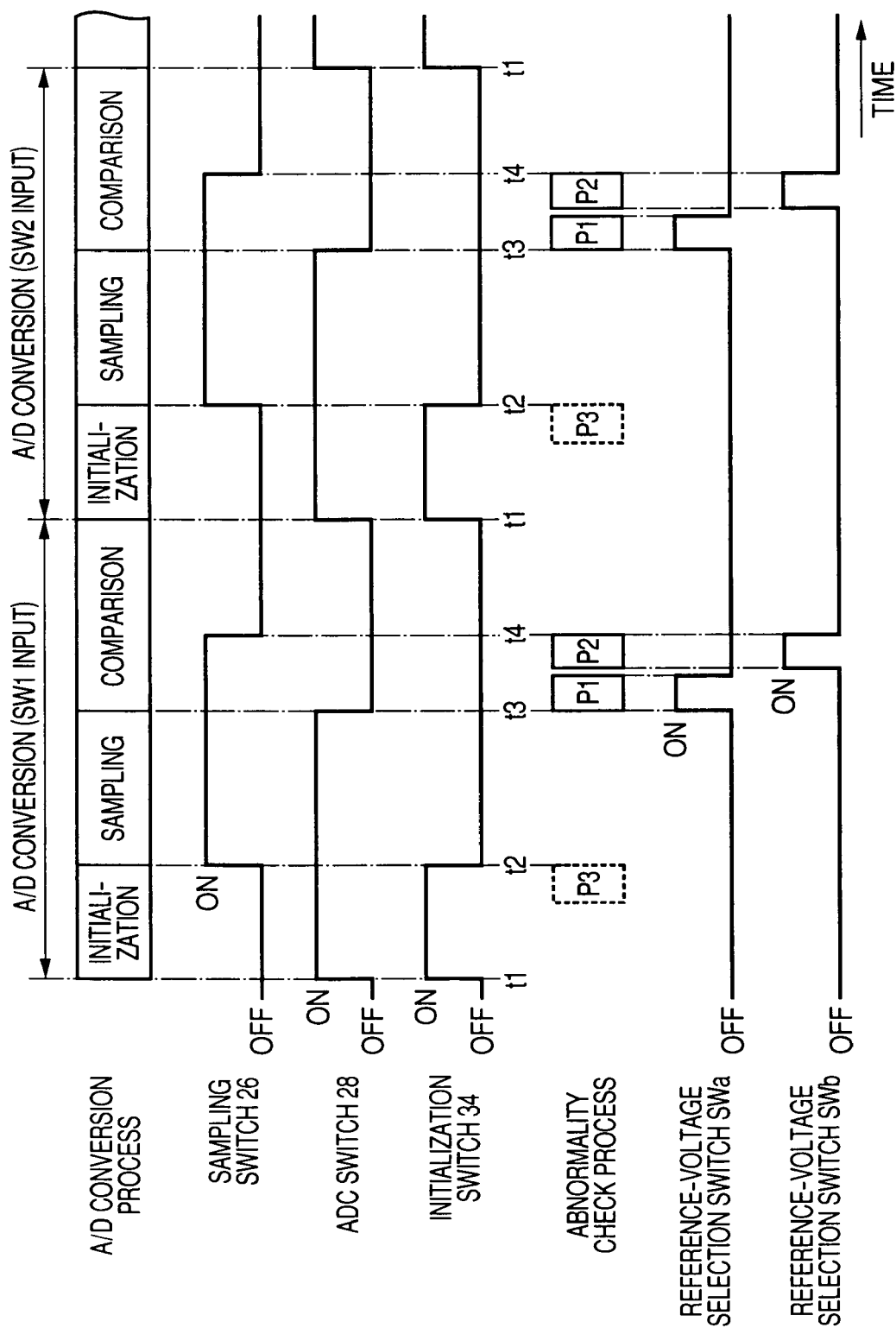
FIG. 3 is a timechart for explaining the operation of the A/D converter device shown in FIG. 1.

This abnormality check process, which is performed after completion of the sampling process (timing t3) for each A/D conversion cycle, begins by turning off the ADC switch 28 and turning on the first reference voltage selection switch SWa of the multiplexer 22 at step S110 in order to apply the first reference voltage (VDD) to the non-inverting input terminal of the comparator 42 (cf. P1 in FIG. 3).

When the first reference voltage selection switch SWa is turned on at step S110, one of the first and second input signal selection switches SW1, SW2 which has been in the on state is changed to the off state.

At next step S120, the abnormality judging signal outputted from the comparator 42 is latched by the control section 40 after an elapse of time required for the output of the comparator 42 to become stable from the time when the first reference voltage selection switch SWa is turned on at step S110, and then it is judged whether the latched abnormality judging signal is at the high level or not.

When the ADC switch 28 is turned off and the first reference voltage selection switch SWa is turned on at step S110, the voltage at the non-inverting input terminal of the comparator 42 should be equal to the first reference voltage (VDD) of the power supply line, and accordingly the output of the comparator 42 should be at the high level as long as the multiplexer 22, sampling switches 24, 26, the ADC switch 28 are operating normally. Accordingly, it is possible to judge whether or not the A/D converter device 20 is functioning normally by checking whether or not the output of the comparator 42 is at the high level.

If the abnormality judging signal is at the high level, it is determined that the A/D converter device 20 is functioning normally, and the check process proceeds to step S140. On the other hand, if the abnormality judging signal is at the low level, it is determined that some kind of abnormality has occurred in the A/D converter device 20, and the ADC abnormality signal indicative of indicative of presence of abnormality is outputted to the CPU 50. And then, the check process proceeds to step S140.

As step S140, the first reference voltage selection switch SWa is turned off, and the second reference voltage selection switch SWb is turned on, so that the second reference voltage (GND) is applied to the non-inverting input terminal of the comparator (cf. P2 in FIG. 3).

As subsequent step S150, the abnormality judging signal outputted from the comparator 42 is latched by the control section 40 after an elapse of time required for the output of the comparator 42 to become stable from the time when the second reference voltage selection switch SWb is turned on at step S140, and it is judged whether the latched abnormality judging signal is at the low level or not.

When the first reference voltage selection switch SWa is turned off and the second reference voltage selection switch SWb is turned on at step S140, the voltage at the inverting input terminal of the comparator 42 should be equal to the ground voltage (0 V) of the ground line, and accordingly the output of the comparator 42 should be at the low level as long as the multiplexer 22, sampling amplifier 24, sampling switches 24, 26, and ADC switch 28 are operating normally. Accordingly, it is possible to judge whether or not the A/D converter device 20 is functioning normally by checking whether or not the output of the comparator is at the low level.

If the abnormality judging signal is at the low level, it is determined that the A/D converter device 20 is functioning normally, and the check process proceeds to step S170. On the other hand, if the abnormality judging signal is at the high level, it is determined that some kind of abnormality has occurred in the A/D converter device 20, and the ADC abnormality signal indicative of indicative of presence of abnormality is outputted to the CPU 50. And then, the check process proceeds to step S170.

At step S170, the second reference voltage selection switch SWb is turned off, and the sampling switch 26 is turned off to prepare for the next A/D conversion process, thereby completing the abnormality check process.

As explained above, the A/D converter device 20 of this embodiment is so configured that the control section 40 successively turns on the first and second reference voltage selection switches SWa, SWb during the comparing period in which the comparator section 30 is disconnected from the signal transfer line in order that the first reference voltage (VDD) and the second reference voltage (GND) are successively applied to the signal transfer line, and checks whether or not the level of the output of the comparator 42 becomes the expected level (high level or low level) when the first reference voltage and the second reference voltage are successively applied to the signal transfer line, to thereby make abnormality judgment on the A/D converter device 20.

With the A/D converter device 20 of this embodiment capable of performing the self-fault diagnosis in synchronization with the A/D conversion cycle while continuously performing the A/D converting operation, even if an abnormality occurs in the A/D converter device 20 while the engine is running at high speed, when it is necessary to perform the A/D converting operation at high speed, it is possible to immediately detect the abnormality to cause the CPU 50 to immediately perform a fail-safe process.

Furthermore, since the A/D converter device 20 of this embodiment is configured to perform the self fault diagnosis by use of the two reference voltage selection switches SWa, SWb, even in a case where the signal transfer line is short-circuited to the power supply line or the ground line, as a result of which the voltage of the signal transfer line is fixed at the voltage of the positive side or the negative side of the DC power supply source, the A/D converter device 20 can detect, in addition to abnormality in the multiplexer 22, sampling amplifier 24, sampling switch 26, or ADC switch 28, a short circuit of the signal transfer line to the power supply line or the ground line.

The A/D converter device 20 of this embodiment can detect indicative of presence of abnormality when there occurs such a state that at least one of the input signal selection switches SW1, SW2 and the reference voltage selection switches SWa, SWb is locked to its off position, and cannot be changed to its on position, and inform the CPU 50 of indicative of presence of the abnormality. However, it means that the A/D converter device 20 outputs the ADC abnormality signal indicative of indicative of presence of abnormality to the CPU 50 even in a case where only the reference voltage selection switch SWa or SWb is locked to its off position, although the AD conversion result itself is correct in this case.

In order to deal with such occasions, in this embodiment, the CPU 50 is so configured as to judge whether or not there is abnormality in the A/D conversion result of a sensor signal received from the A/D converter device 20, and if it is determined that there is abnormality in the A/D conversion result, judge whether the abnormality in the A/D conversion result is due to abnormality in the A/D converter device 20 itself, or abnormality in a sensor outputting the sensor signal to the A/D converter device 20, and perform a fail safe process in accordance with a result of the judgment.

Next, explanation is made as to how the CPU 50 makes an abnormality judgment on the A/D conversion result by taking as an example a case where the engine ECU 10 receives a sensor signal (ion current detection signal) from an ion current detecting device 3 (see FIG. 5) operating as a misfire detecting sensor.

As shown in FIG. 5, the ion current detecting device 3, which is provided in each cylinder of the internal combustion engine together with an ignition device 7, operates to pass a current i2 to a secondary winding L2 of an ignition coil 7b of the ignition device 7 in a direction opposite to the direction in which an ignition current i1 passes after completion of spark discharge of a spark plug 7a of the ignition device 7, and to detect the value of the current i2.

The ion current detecting device 3 includes a resistor R21 connected to the ground line at one end thereof, a capacitor 21 connected between the resistor R21 and the secondary winding L2 of the ignition coil 7b to be discharged by the ignition current i1 to accumulate therein charge for ion current detection, a Zener diode D21 connected in parallel to the capacitor C21 with its cathode being connected to the secondary winding L2 of the ignition coil 7b to limit the voltage across the capacitor C21 to within a breakdown voltage of the Zener diode D21, a Zener diode D23 connected in parallel to the resistor R21 with its cathode being connected to the ground line to limit the voltage across the resistor R21 to within a breakdown voltage of the Zener diode D23, and an detecting circuit 3a whose input terminal is connected to a connection node between the resistor R21 and the capacitor C21 to output the ion current detection signal having a signal level depending on a voltage at this connection node.

An operation of the ion current detecting device 3 having the above described structure is explained below. When a transistor TR1 connected to a primary winding L1 of the ignition coil 7b at a collector thereof and connected to the ground line at an emitter thereof is turned on and off to induce the ignition current i1 in the secondary winding L2 (that is, when spark discharge is generated), the capacitor C21 is charged by this ignition current i1 to build up a voltage for ion current detection, and this voltage built up in the capacitor C21 is applied to the spark plug 7a after completion of the spark discharge of the spark plug 7a.

At this time, if a fuel/air gas mixture is burning in a cylinder as a result of the spark discharge of the spark plug 7a, since ions occur in the cylinder, an ion current at a certain level flows between the two opposing electrodes of the spark plug 7a. On the other hand, if the fuel/air gas mixture is not burning at the time in the cylinder (that is, when the cylinder is misfired), since ions do not occur in the cylinder, a very small ion current flows.

Hence, the voltage at the connection node between the resistor R21 and the capacitor C21 varies with time depending on the ignition current i1 when the spark discharge of the ignition plug 7a occurs and the ion current flowing after completion of the spark discharge. As shown in FIG. 6A, the detecting circuit 3a is configured to output, when the voltage at the node becomes negative as a result of the flow of the ion current, the ion current detection signal having a signal level depending on the value of this negative voltage.

As shown in FIG. 5, to receive the ion current detection signal outputted from the ion current detecting device 3, the engine ECU 10 is provided with an input circuit 13 including a pull-up resistor R11, a noise removing filter constituted by a resistor R13, a capacitor C13, a resistor R15 and a capacitor C15, and diodes D11, D13 for limiting the signal level of the ion current detection signal within an allowable input range of the A/D converter device 20.

Accordingly, the A/D converter device 20 included in the engine ECU10 receives the ion detection signal which is normally at the power supply voltage (VDD), and falls below the power supply voltage (VDD) on and after the spark discharge of the spark plug 7a. The A/D converter device 20 successively A/D converts the ion current detection signals for all the cylinders, and outputs the A/D conversion results to the CPU 50.

The CPU 50 monitors, for each cylinder of the internal combustion engine, the A/D conversion result of the ion current detection signal outputted from the A/D converter device 20 over a predetermined misfire judging period starting from timing tb which is after a predetermined spark discharge time from ignition timing ta and ending at timing tc at which it is estimated that the ion current stops flowing, and detects the maximum value of the A/D conversion result. And the CPU 50 makes a misfire judgment for each cylinder, that is, judges for each cylinder whether the fuel/air gas mixture is burning normally or a misfire has occurred depending on whether the detected maximum value exceeds a predetermined misfire judging threshold.

In addition, the CPU 50 makes the abnormality judgment on the A/D conversion result, and makes a distinction between abnormality in the A/D converter device 20 and abnormality between the ion current detecting device 3. In this embodiment, the abnormality judgment on the A/D conversion result and the abnormality judgment (or smoldering judgment on the spark plug 7a) on the ion current detecting device 3 are made altogether.

There can occur smoldering in the spark plug 7a, in which the insulation resistance between the two opposing electrodes of the spark plug 7a is lowered due to adherence of substance such as carbon thereto. If the insulation resistance is lowered excessively, the ion current detecting device 3 can make false detection of the ion current when there occurs misfire.

Accordingly, in this embodiment, the current flowing between the two opposing electrodes of the spark plug 7a is monitored on the basis of the ion current detection signal outputted from the ion current detecting device 3 from when an ignition signal IGT of high level is applied to the transistor TR1 at timing td to thereby pass a current to the primary winding L1 of the ignition coil 7b until a predetermined sensor abnormality judging period (700 μs, for example) is passed in order to measure the length of a time Ts (T1+T2 in FIG. 6B) during which the monitored value exceeds a predetermined abnormality judging threshold, and it is judged that there is abnormality in the ion current detection signal received from the A/D converter device 20 if the measured time Ts is not within an allowable range between a predetermined lower limit time (50 μs, for example) and a predetermined upper limit time (500 μs, for example).

To measure the time Ts (referred to as over-threshold time Ts hereinafter), the CPU 50 takes in the A/D conversion result of the ion current detection signal outputted from the A/D converter device 20 for each cylinder over the above described sensor abnormality judging period after outputting the ignition signal IGT to the ignition device of each cylinder, and judges whether or not the ion current exceeds the abnormality judging threshold on the basis of this A/D conversion result. However, as evident from FIG. 6B, since the A/D conversion result outputted from the A/D converter device 20 takes its maximum when the value of the current flowing between the two opposing electrodes of the spark plug 7a is zero, and decreases as the value of this current increases, actually, the CPU 50 can determine the length of a time during which the A/D conversion result outputted from the A/D converter device 20 is below the abnormality judging threshold as the over-threshold time Ts.

The reason why abnormality judgment on the ion current detecting device 3 can be also used as abnormality judgment on the A/D conversion result is that the length of the over-threshold time TS during which the current flowing between the two opposing electrodes of the spark plug 7a exceeds the abnormality judging threshold varies to some extent depending on the extent of smoldering of the spark plug 7a, however, in a case where the A/D converting device 20 is out of order, causing the A/D conversion result to be fixed at its maximum value or its minimum value, the length of the over-threshold time TS becomes 0, or becomes as large as the sensor abnormality judging period, and as a result it deviates from the allowable range between the lower limit time and the upper limit time. Incidentally, since the reason why it is possible to make the abnormality judgment on the ion current detecting device 3 related to smoldering by use of the method described above is well known (refer to Japanese Patent Application Laid-open No. 11-50941, for example), detailed explanation thereof is omitted here.

Next, the abnormality judging process performed by the CPU 50 is explained with reference to the flowchart of FIG. 7. This abnormality judging process, which is a process which the CPU 50 performs for each cylinder in synchronization with the rotation of the internal combustion engine together with the measuring process of the over-threshold time Ts, begins by judging whether or not the measured over-threshold time Ts is shorter than the lower limit time at step S210. If it is judged that the measured over-threshold time Ts is shorter than the lower limit time, since it means that there is some kind of abnormality in the A/D conversion result of the ion current detection signal, the process proceeds to step S220 where it is judged whether or not the ADC abnormality signal indicative of indicative of presence of abnormality is being inputted from the A/D converter device 20.

If it is judged that the ADC abnormality signal is being inputted from the A/D converter device 20, the process proceeds to step S230 where it is determined that there is abnormality in the A/D converter device 20, an alarm lamp is lit to indicate this, reception of the detection signal from the A/D converter device 20 is stopped, and a fails-safe process is activated to safely stop the internal combustion engine, thereby completing the abnormality judging process.

If it is judged at step S220 that the ADC abnormality signal is not being inputted from the A/D converter device 20, the process proceeds to step S240 where an input line between the ion current detecting device 3 and the A/D converter device 20 is determined to be broken, the alarm lamp is lit to indicate this, and a fail safe process is activated to reduce a fuel injection amount, or stop fuel injection for the corresponding cylinder, thereby completing the abnormality judging process.

On the other hand, if it is judged that the measured over-threshold time Ts is not shorter than the lower limit time, then it is judged at step S250 whether or not the measured over-threshold time Ts is longer than the upper limit time. If it is judged that the measured over-threshold time Ts is longer than the upper limit time, the process proceeds to step S260 where it is judged whether or not the ADC abnormality signal indicative of indicative of presence of abnormality is being inputted from the A/D converter device 20.

If it is judged that the ADC abnormality signal is being inputted from the A/D converter device 20, the process proceeds to step S270 where it is determined that there is abnormality in the A/D converter device 20, the alarm lamp is lit to indicate this, reception of the detection signal from the A/D converter device 20 is stopped, and the fails-safe process is activated to safely stop the internal combustion engine, thereby completing the abnormality judging process.

If it is judged at step S260 that the ADC abnormality signal is not being inputted from the A/D converter device 20, the process proceeds to step S280 where it is determined that the ion current detecting device 3 is not functioning normally probably due to smoldering of the spark plug 7a, the alarm lamp is lit to indicate this, and the fail safe process is activated to reduce a fuel injection amount, or stop fuel injection for the corresponding cylinder, thereby completing the abnormality judging process.

As described above, the engine ECU 10 of this embodiment not only determines abnormality of the A/D converter device 20 by use of the self-diagnosis function provided with the A/D converter device 20, but also determines abnormality of the A/D converter device 20 if the CPU 50 judges that there is abnormality in the A/D conversion result outputted from the A/D converter device 20 when the A/D converter device 20 is outputting the ADC abnormality signal indicative of indicative of presence of abnormality.

Accordingly, even when the first and the second reference voltage selection switches SWa or SWb is locked to its off position, and as a result the AD converter device 20 outputs the ADC abnormality signal indicative of indicative of presence of abnormality, the engine ECU 10 can carry on the normal engine control, as long as the A/D converter device 20 correctly performs the A/D conversion process.

In addition, this embodiment is configured to judge, when it can be determined that there is abnormality in the ion current detecting device 3 on the basis of the A/D conversion result (the measured over-threshold time Ts) after passing a current to the primary winding L1 of the ignition coil 7b, and the self-diagnosis result (presence or absence of the ADC abnormality signal), whether this abnormality is due to breakage of the ion detection signal input line, or fault of the ion current detecting device 3 itself in accordance with whether the measured over-threshold time Ts is shorter than the lower limit time, or longer than the upper limit time. This makes it possible for a user or a vehicle driver to recognize the cause of the abnormality by viewing the alarm lamp, for example, to immediately remove the abnormality.

Although the operation of the CPU 50 to make the abnormality judgment on the A/D conversion result has been explained taking as an example the case where the CPU 50 takes in the ion current detection signal from the ion current detecting device 3, it is possible for the CPU 50 to judge whether abnormality in the A/D conversion result is due to breakage of a sensor signal input line, or fault of a sensor other than the ion current detecting device 3, which is outputting this sensor signal, by performing the abnormality judging process shown in FIG. 7 on the A/D conversion result of this sensor signal.

In this case, if it is not possible to make the abnormality judgment on the A/D conversion result by monitoring a changing state of the A/D conversion result (such as the over-threshold time Ts), the abnormality judgment may be made in accordance with whether or not the A/D conversion result is fixed at its maximum value or its minimum value.

First Variant

In the above described first embodiment, the first and second reference voltage selection switches SWa, SWb of the multiplexer 22 operate to directly applying the sampling amplifier 24 with the first reference voltage (the power supply voltage VDD) and the second reference voltage (ground voltage GND), respectively. However, as shown in FIG. 8, resistors R31, R32 having a resistance larger than that of the pull-up resistor R1 and pull-down resistor R2 may be connected respectively between the first reference voltage selection switch SWa and the power supply line, and between the second reference voltage selection switch SWb and the ground line.

According to this configuration in which the sampling amplifier 24 is applied with the first reference voltage (power supply voltage VDD) or the second reference voltage (ground voltage GND) through the resistor R31 or the resistor R32, it is possible for the control section 40 detects indicative of presence of abnormality also when the input signal selection switch SW1 or SW2 is locked to its on position.

Unlike this configuration, in the above described first embodiment, although the control section 40 can detect indicative of presence of abnormality when any one of the first and second input signal selection switches SW1, SW2, and the first and second reference voltage selection switches SWa, SWb is locked to its off position, it cannot detect indicative of presence of abnormality when the input signal selection switch SW1 or SW2 is locked to its on position, because in this case, the voltage of the signal transfer line when the reference voltage selection switch SWa or SWb is turned on in the abnormality check process (1) or (2) becomes the power supply voltage VDD or the ground voltage GND.

Figure 4:
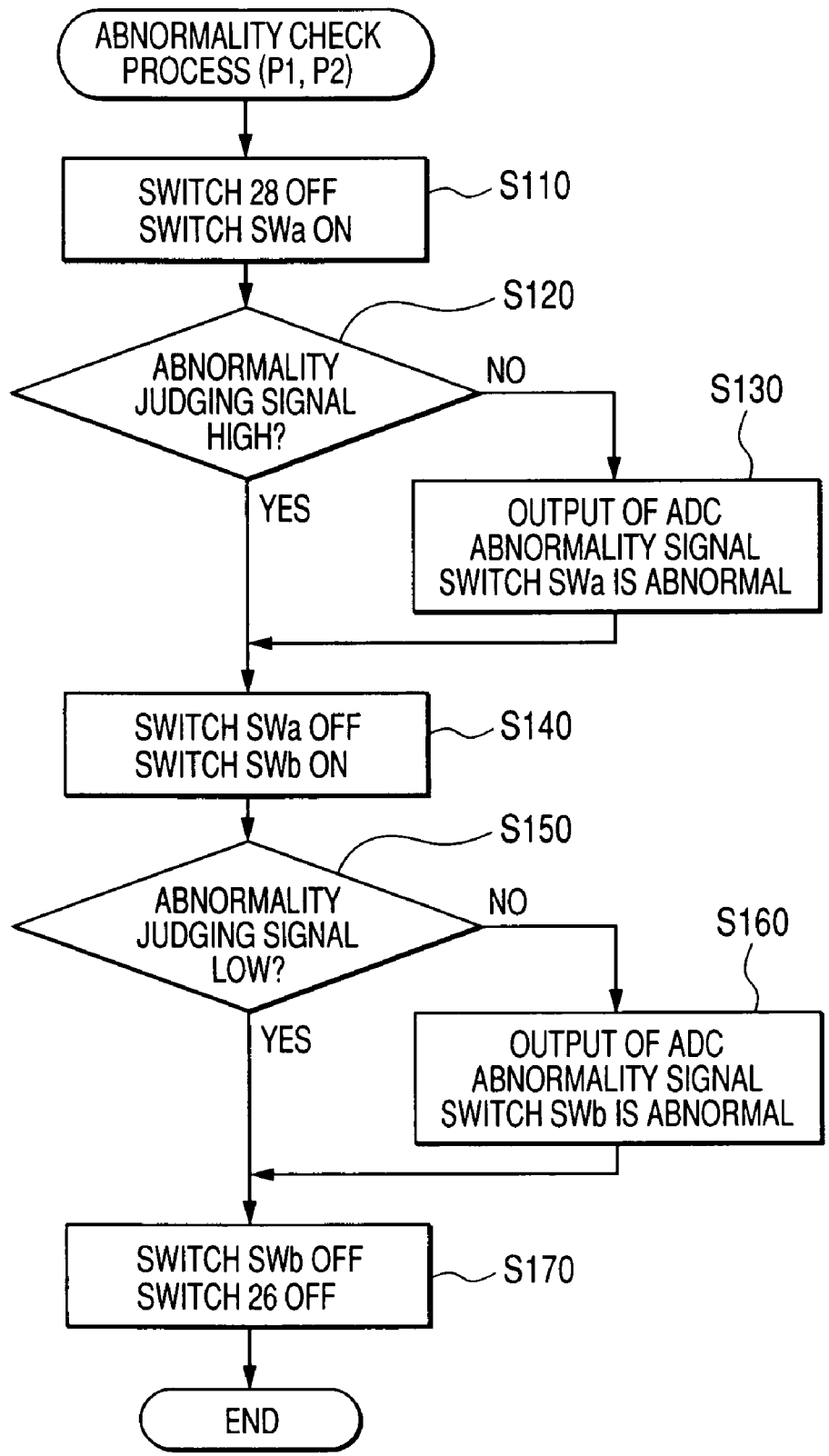
FIG. 4 is a flowchart showing an abnormality check process performed by a control section of the A/D converter device shown in FIG. 1.
Figure 8:
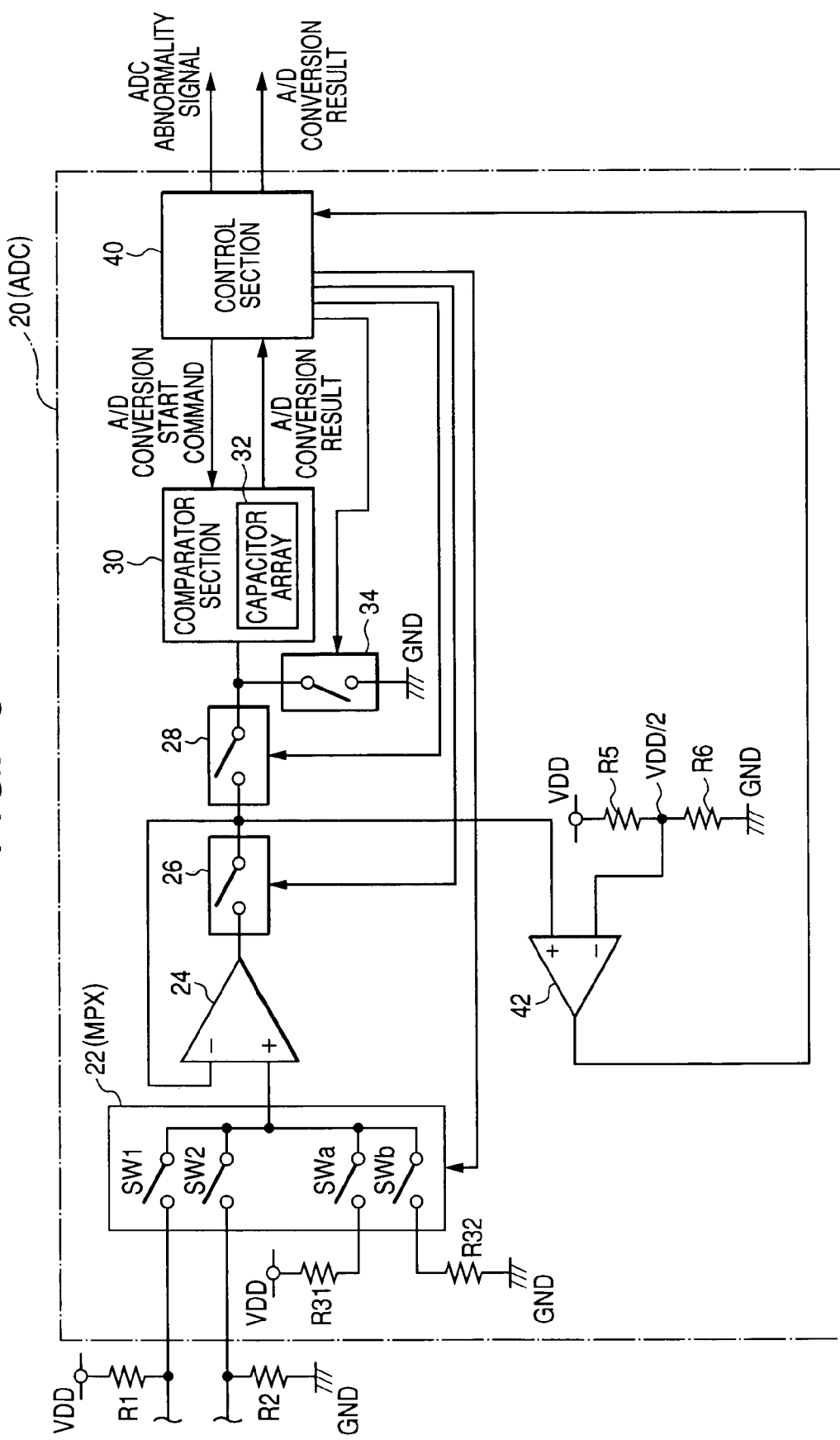
FIG. 8 is a block diagram showing a structure of a first variant of the A/D converter device shown in FIG. 2.

On the other hand, in the configuration of FIG. 8, if the first input signal selection switch SW1 is abnormally locked to its on position, since when the second reference voltage selection switch SWb is turned on during the abnormality check process (2), the voltage of the signal transfer line becomes equal to the divided power supply voltage VDD divided down by the pull-up resistor R1 and the resistor R32, which is higher than the abnormality judging voltage, the abnormality in the A/D converter device 20 is detected at step S160 of the abnormality check process of FIG. 4. Likewise, if the second input signal selection switch SW2 is abnormally locked to its on position, since when the first reference voltage selection switch SWa is turned on during the abnormality check process (1), the voltage of the signal transfer line becomes equal to the divided power supply voltage VDD divided down by the pull-down resistor R2 and the resistor R31, which is lower than the abnormality judging voltage, the abnormality in the A/D converter device 20 is detected at step S130 of the abnormality check process of FIG. 4.

Second Variant

Figure 9:
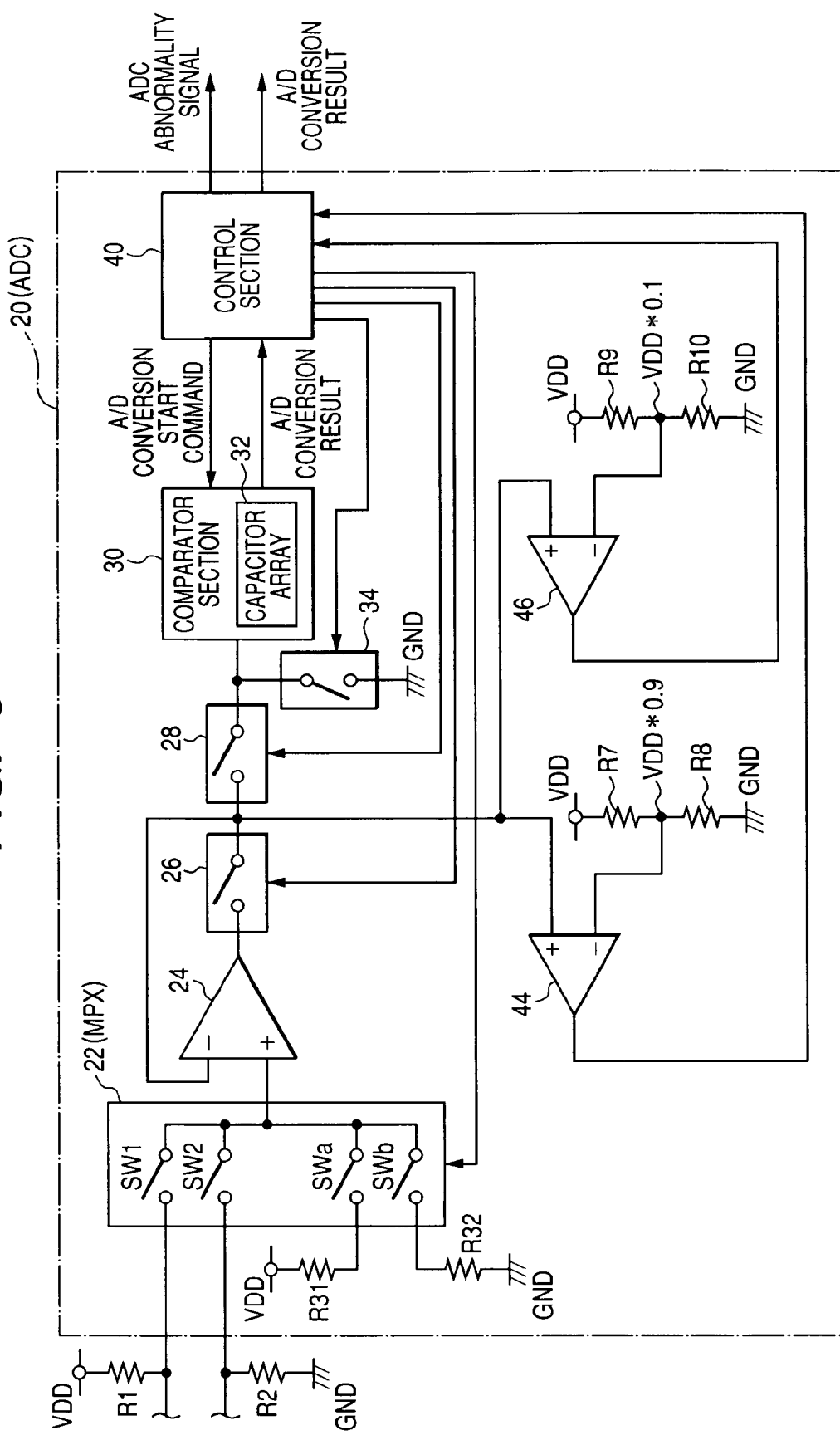
FIG. 9 is a block diagram showing a structure of a second variant of the A/D converter device shown in FIG. 2.

The configuration of FIG. 8 may be further modified as shown in FIG. 9 in which two comparators 44, 46 are provided. The comparator 44, which is used for performing the abnormality check process (1), and to be more precise, for performing step S120 of FIG. 4, is applied with an abnormality judging voltage produced by dividing down the power supply voltage VDD by a series connection of resistors R7 and R8 to a voltage higher than half the power supply voltage VDD (VDD×0.9, for example). On the other hand, The comparator 46, which is used for performing the abnormality check process (2), and to be more precise, for performing step S150 of FIG. 4 is applied with an abnormality judging voltage produced by dividing down the power supply voltage VDD by a series connection of resistors R9 and R10 to a voltage lower than half the power supply voltage VDD (VDD×0.1, for example).

This configuration makes it possible to detect abnormality in the A/D converter device 20 even in a case where on-resistances of the first and second input signal selection switches SW1, SW2 increase, causing the signal level of the input signal to be excessively reduced.

Second Embodiment

The first embodiment is configured such that if the CPU 50 detects abnormality in the A/D conversion result, the CPU 50 distinguishes which of the A/D converter device 20 and the ion current detecting device 3 is not functioning normally. However, in a case where the first input signal selection switch SW1 or the second input signal selection switch SW2 is abnormally locked to its off position, but the first and the second reference voltage selection switches SWa, SWb are functioning normally, since the control section 40 of the A/D converter device 20 cannot detect this, the CPU 50 judges that there is abnormality in the ion current detecting device 3, and informs the vehicle driver of erroneous abnormality information through the alarm lamp.

Figure 10:
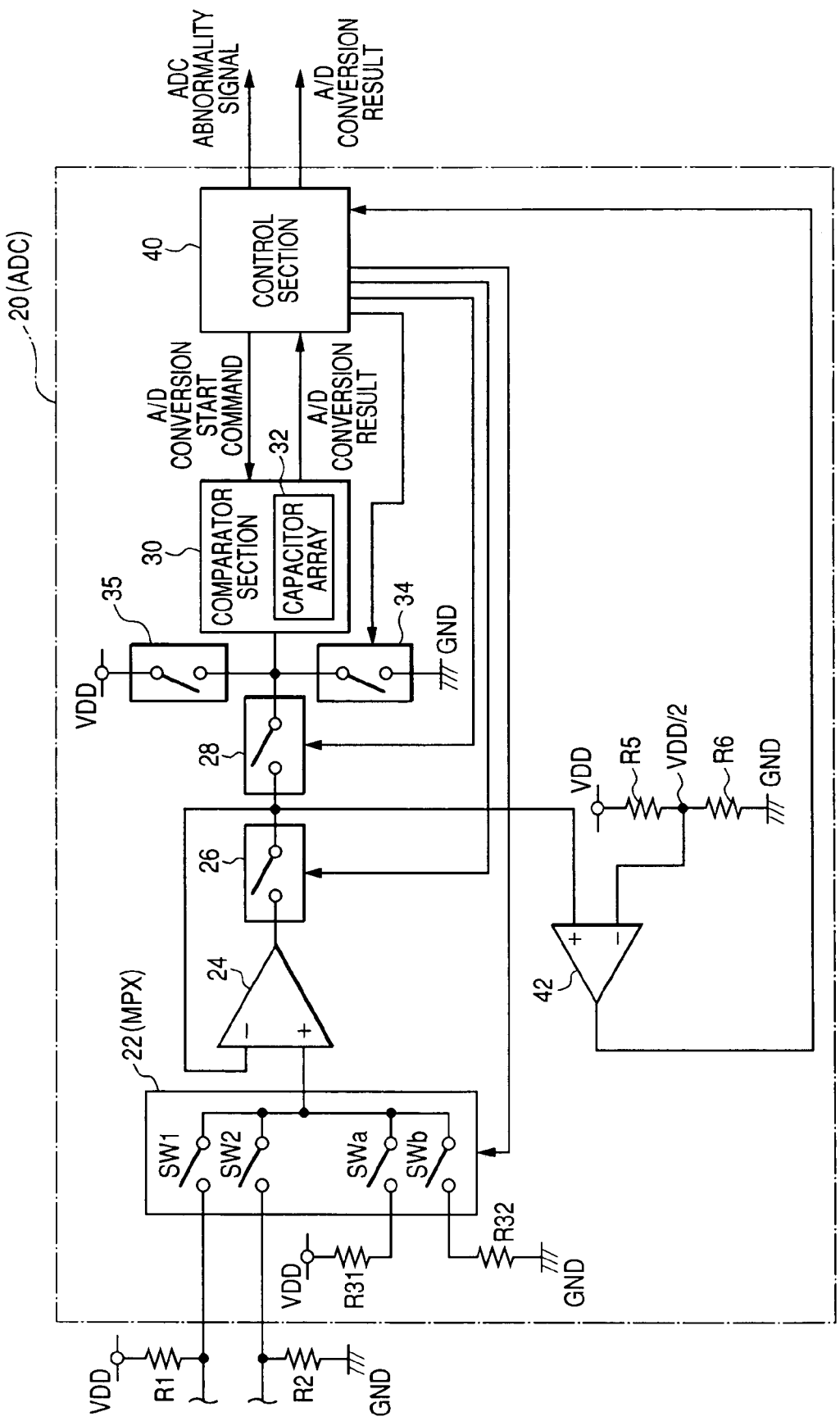
FIG. 10 is a block diagram showing an A/D converter device according to a second embodiment of the invention.

It is preferable that the CPU 50 can detect indicative of presence of abnormality when one of the input signal selection switches SW1, SW2 is abnormally locked to its off position. Accordingly, the A/D converter device 20 of the second embodiment has a structure as shown in FIG. 10.

The structure of the A/D converter device 20 of this embodiment is different from that of the first variant shown in FIG. 8 in that initialization switches 34 and 35 are additionally provided. The initialization switch 34 is for initializing the capacitor array 32 by use of the ground line having a polarity opposite to that of the power supply line to which the input line of the ion current detection signal from the ion current detecting device 3 is connected through the pull-up resistor R1. The initialization switch 35 is for initializing the capacitor array 32 by use of the power supply line to which the input line of the ion current detection signal from the ion current detecting device 3 is connected through the pull-up resistor R1.

Figure 11:
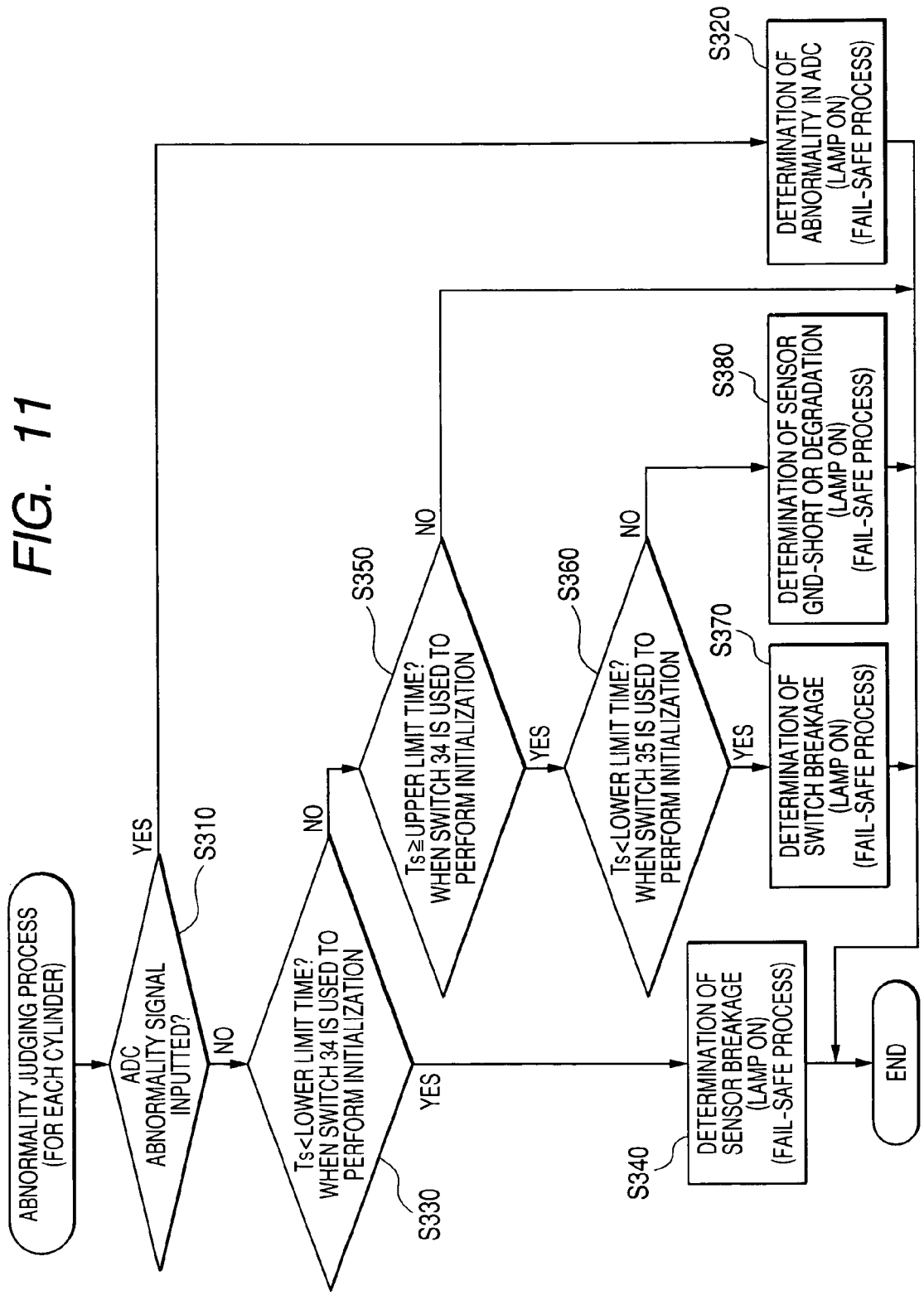
FIG. 11 is a flowchart showing an abnormality judging process performed by a CPU of an engine ECU including the A/D converter device according to the second embodiment of the invention.

In this embodiment, the CPU 50 performs an abnormality judging process shown in the flowchart of FIG. 11 when receiving the ion current detection signal outputted from the ion current detecting device 3.

This abnormality judging process begins by judging, at step S310, whether or not the ADC abnormality signal indicative of indicative of presence of abnormality is being inputted from the A/D converter device 20. If it is judged that the ADC abnormality signal is being inputted from the A/D converter device 20, the process proceeds to step S320 where it is determined that there is abnormality in the A/D converter device 20, an alarm lamp is lit to indicate this, reception of the detection signal from the A/D converter device 20 is stopped, and a fail-safe process is activated to safely stop the internal combustion engine, thereby completing the abnormality judging process.

If it is judged at step S310 that the ADC abnormality signal is not being inputted from the A/D converter device 20, the process proceeds to step S330 where it is judged whether or not the over-threshold time Ts measured when the control section 40 of the A/D converter device 20 initializes the capacitor array 32 by use of the initialization switch 34 is shorter than the lower limit time.

If it is judged at step S330 that the measured over-threshold time Ts is shorter than the lower limit time, the process proceeds to step S340 where it is determined that the input line between the ion current detecting device 3 and the A/D converter device 20 is broken, an alarm lamp is lit to indicate this, and a fail safe process is activated to reduce a fuel injection amount, or stop fuel injection for the corresponding cylinder, thereby completing the abnormality judging process.

On the other hand, if it is judged at step S330 that the measured over-threshold time Ts is not shorter than the lower limit time, the process proceeds to step S350 where it is judged whether or not the over-threshold time Ts measured when the control section 40 of the A/D converter device 20 initializes the capacitor array 32 by use of the initialization switch 34 is longer than the upper limit time. If it is judged that the measured over-threshold time Ts is not longer than the upper limit time, this abnormality judging process is terminated.

If it is judged at step S350 that the measured over-threshold time Ts is longer than the upper limit time, the process proceeds to step S360 where it is judged whether or not the over-threshold time Ts measured when the control section 40 of the A/D converter device 20 initializes the capacitor array 32 by use of the initialization switch 35 is shorter than the lower limit time.

If it is judged at step S360 that the measured over-threshold time Ts is shorter than the lower limit time, the process proceeds to step-S370 where it is determined that the input signal selection switch used for taking in the ion current detection signal from the ion current detecting device 3 is broken (switch breakage), an alarm lamp is lit to indicate this, and a fail safe process is activated to reduce a fuel injection amount, or stop fuel injection for the corresponding cylinder, thereby completing the abnormality judging process.

If it is judged at step S360 that the measured over-threshold time Ts is not shorter than the lower limit time, the process proceeds to step S380 where it is determined that there is abnormality in the ion current detecting device 3 other than the switch breakage, the alarm lamp is lit to indicate this, and the fail safe process is activated to reduce a fuel injection amount, or stop fuel injection for the corresponding cylinder, thereby completing the abnormality judging process.

Incidentally, the abnormality in the ion current detecting device 3 detected at step S380 includes degradation of the ion current detecting device 3 itself due to smoldering of the spark plug 7a, and a short circuit of the input line between the ion current detecting device 3 and the CPU 50 to the ground line.

As explained above, this embodiment is configured to determine that the input line of the ion current detection signal from the ion current detecting device 20 is broken, if the CPU 50 detects, by performing the abnormality judging process shown in FIG. 11, that when the ADC abnormality signal indicative of indicative of presence of abnormality is not being outputted from the A/D converter device 20, the over-threshold time Ts measured when the capacitor array 32 of the A/D converter device 20 is initialized by the initialization switch 34 is shorter than the lower limit time, and determine that the input signal selection switch used for taking in the ion current detection signal outputted from the ion current detecting device 3 is broken if the CPU 50 detects that this measured over-threshold time Ts is longer than the upper limit, and that the over-threshold time Ts measured when the capacitor array 32 of the A/D converter device 20 is initialized by the initialization switch 35 is shorter than the lower limit time.

The reason is that, as indicated in Table 1, it is possible to detect a breakage of the input line of the ion current detection signal outputted from the ion current detecting device 3 as the first sensor 1, because the A/D conversion result AD1 obtained at the time when the capacitor array 32 is initialized by the initialization switch 34 is fixed to its maximum value corresponding to the power supply voltage (VDD), as a result of which the measured over-threshold time Ts becomes shorter than the lower limit time, however, if the A/D conversion result AD1 obtained when the capacitor array is initialized by the initialization switch 34 is fixed to its minimum value corresponding to the voltage of the ground line (GND), as a result of which the measured over-threshold time Ts becomes longer than the upper limit time, it cannot be determined that the first sensor (ion current detecting device 3) is degraded or short circuited to the ground, because if the input signal selection switch used to take in the detection signal from the first sensor (ion current detecting device 3) is abnormally locked to its off position, the same state occurs.

TABLE 1

| | SWITCH THAT HAS BEEN USED TO INITIALIZE CAPACITOR ARRAY 32 | |
|---|---|---|
| | SWITCH 34 ON THE GND SIDE | SWITCH 35 ON THE VDD SIDE |
| BREAKAGE OF 1st SENSOR | AD1: FIXED AT VDD (Ts < Lt) | AD1: FIXED AT VDD (Ts < Lt) |
| GND-SHORT OR DEGRADATION OF 1st SENSOR | AD1: FIXED AT GND (Ut ≦ Ts) | AD1: FIXED AT GND (Ut ≦ Ts) |
| BREAKAGE OF SWITCH SW1 | AD1: FIXED AT GND (Ut ≦ Ts) | AD1: FIXED AT VDD (Ts < Lt) |
| NORMAL | AD1: ANY VALUE (Lt ≦ Ts < Ut) | AD1: ANY VALUE (Lt ≦ Ts < Ut) |

Lt: Lower limit time
Ut: Upper limit time

Accordingly, as indicated in Table 1, in a case where the A/D conversion result AD1 obtained when the capacitor array 32 is initialized by the initialization switch 34 is fixed to its minimum value corresponding to the voltage of the ground line (GND), causing the measured over-threshold time Ts to become longer than the upper limit time, if the first input signal selection switch SW1 is broken, the A/D conversion result AD1 obtained when the capacitor array 32 is initialized by the initialization switch 35 is fixed to its maximum value corresponding to the voltage of the power supply line (VDD), causing the measured over-threshold time Ts to be shorter than the lower limit time, while if the first sensor (ion current detecting device 3) has been degraded or short circuited to the ground, the A/D conversion result AD1 obtained when the capacitor array 32 is initialized by the initialization switch 35 is fixed to its minimum value corresponding to the voltage of the ground line (VDD), causing the measured over-threshold time Ts to become longer than the upper limit time.

Accordingly, in this embodiment, the initialization switch 34 on the ground line side and the initialization switch 35 on the power supply line side are switched therebetween each time the cylinder is fired, and a distinction is made between fault of the first sensor (ion current detecting device 3) and a breakage of the first input signal selection switch SW1 on the basis of the difference between the measured over-threshold time Ts obtained when the capacitor array 32 is initialized by the initialization switch 34 and the measured over-threshold time Ts obtained when the capacitor array 32 is initialized by the initialization switch 35.

Accordingly, according to this embodiment, "switch breakage" which cannot be detected on the side of the A/D converter device 20 can be detected on the side of the CPU 50, and the fail-safe process can be performed immediately when "switch breakage" is detected.

Incidentally, it is preferable that the control section 40 makes a change between the initialization switches 34, 35 to be used for initializing the comparator section 30 only when the A/D converter device is powered on, and thereafter uses the same one of the initialization switches 34, 35, because there is possibility that the A/D conversion result exhibits an offset if the initialization switches 34, 35 are switched frequently therebetween.

In the above, the operation of the CPU 50 to perform the abnormality judging process has been explained taking as an example the case where the CPU 50 takes in the ion current detection signal from the ion current detecting device 3. It should be noted that in the case of the first sensor outputting its detection signal through the input line connected to the power supply line through the pull-up resistor R1, it is when the A/D conversion result AD1 takes its minimum value corresponding to the voltage of the ground line (GND) that the measured over-threshold time Ts becomes longer than the upper limit time, and it is when the A/D conversion result AD1 takes its maximum value corresponding to the voltage of the power supply line (VDD) that the measured over-threshold time Ts becomes shorter than the lower limit time as indicated in Table 1. Accordingly, also when the CPU 50 receives a detection signal from the first sensor other than the ion current detecting device 3 through the A/D converter device 20, it is possible to recognize, breakage of the first input signal selection switch SW1 by judging whether or not the A/D conversion result received from the A/D converter device 20 is fixed to its maximum value or its minimum value.

In the case of the second sensor 2 outputting a sensor signal through an input line connected to the ground line through the pull-down resistor R2, the correspondence relationship between the A/D conversion result AD2 obtained when there is abnormality in the second sensor or the second input signal selection switch SW2, and the initialization switch 34 or 35 is as indicated in Table 2. In this case, although it is not possible to distinguish abnormality content by use of the same process performed in the case of the first sensor, it becomes possible to recognize breakage of the second input signal selection switch SW2 if the abnormality judging process of FIG. 11 is modified in accordance with Table 2.

TABLE 2

| | SWITCH THAT HAS BEEN USED TO INITIALIZE CAPACITOR ARRAY 32 | |
|---|---|---|
| | SWITCH 34 ON THE GND SIDE | SWITCH 35 ON THE VDD SIDE |
| BREAKAGE OF 2nd SENSOR VDD-SHORT OR DEGRADATION OF 2nd SENSOR | AD2: FIXED AT GND AD2: FIXED AT VDD | AD2: FIXED AT GND AD2: FIXED AT VDD |
| BREAKAGE OF SWITCH SW2 | AD2: FIXED AT GND | AD2: FIXED AT VDD |
| NORMAL | AD2: ANY VALUE | AD2: ANY VALUE |

Third Variant

In the above described embodiments, the control section 40 of the A/D converter device 20 has been described as to successively turn on the first and second reference voltage selection switches SWa, SWb, and make the self-diagnosis of the A/D converter device 20 on the basis of the output signal level of the comparator 42 at the time by performing the abnormality check processes (1), (2) shown in FIG. 3 and FIG. 4 during the comparing period in the A/D conversion cycle. However, although the abnormality check processes (1), (2) enable to detect abnormality in the multiplexer 22, they do not enable to detect abnormality in the ADC switch 28, and the initialization switch 34, or 35.

In this variant, the control section 40 of the A/D converter device 20 performs an abnormality check process (P3) during the initializing period in which the sampling switch 26 is turned off, and the ADC switch 28 is turned on as shown in FIG. 3, so that abnormality in the ADC switch 28 and the initialization switch 34 or 35 can be detected.

Next, this abnormality check process (P3) is explained with reference to the flowchart of FIG. 12.

This abnormality check process (P3) is performed by the control section 40 during the initializing period (preferably, just before the initializing period is terminated) in which one of the initialization switches 34 and 35 is turned on.

Figure 12:
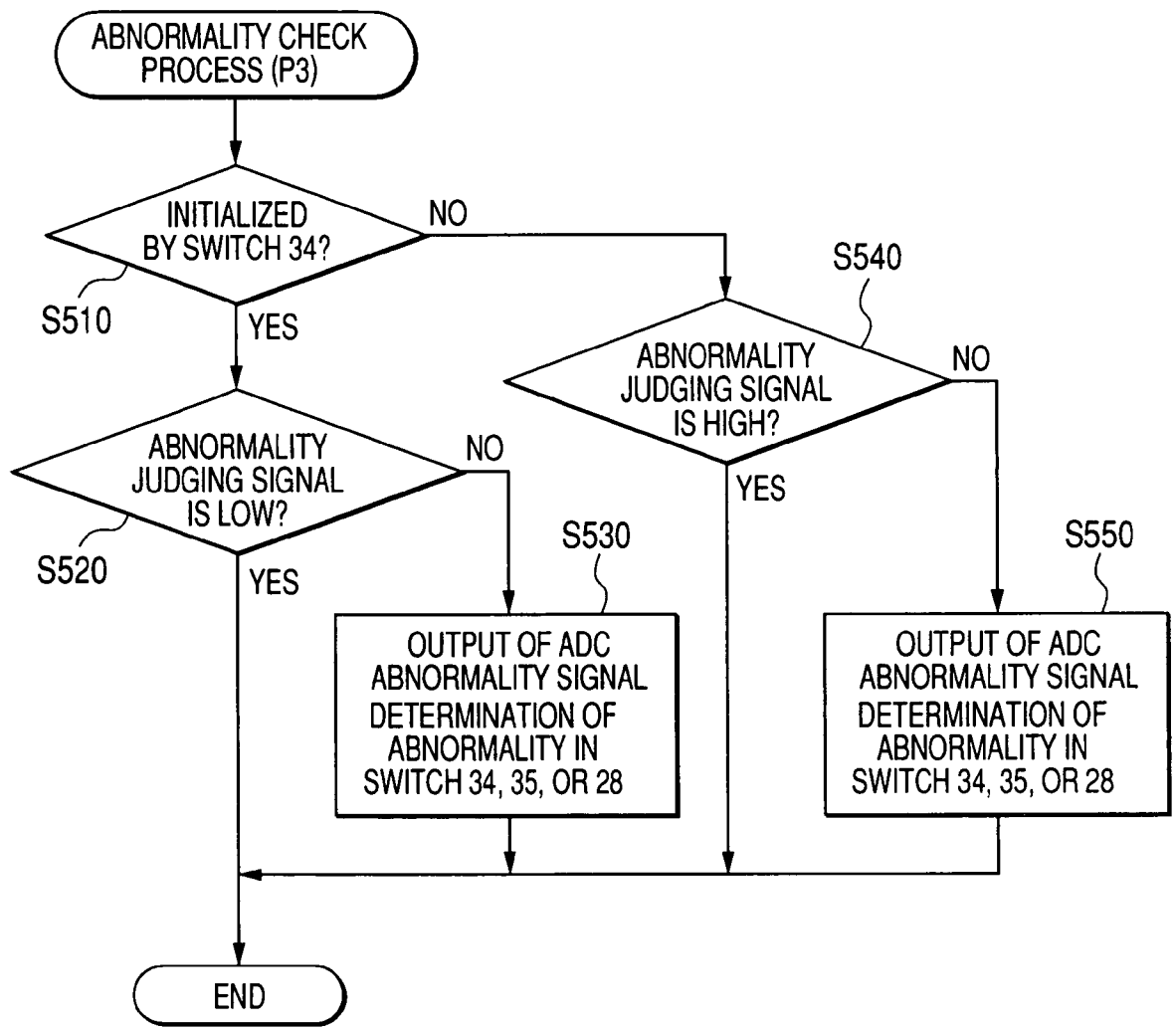
FIG. 12 is a flowchart showing an abnormality check process performed by a control section of the A/D converter device shown in FIG. 10.

As shown in FIG. 12, the abnormality check process (P3) begins by judging at step S510 whether or not the initialization switch 34 on the ground line side is being used to initialize the capacitor array 32. If it is judged that the initialization switch 34 on the ground line side is being used to initialize the capacitor array 32, the process proceeds to step S520 where it is judged whether or not the abnormality judging signal outputted from the comparator 42 is at the low level corresponding to the case of the input voltage of the comparator 42 being at the ground voltage. If it is judged that the abnormality judging signal outputted from the comparator 42 is at the low level, since it means that the initialization switches 34, 35, and the ADC switch 28 are operating normally, this abnormality check process (P3) is terminated.

On the other hand, if it is judged at step S520 that the abnormality judging signal outputted from the comparator 42 is not at the low level, the process proceeds to step S530 where it is determined that there is abnormality in the initialization switches 34, 35, or the ADC switch 28, and the control section 40 outputs the ADC abnormality signal indicative of indicative of presence of abnormality to the CPU 50 before terminating the abnormality check process (3).

If it is judged at step s510 that the initialization switch 34 on the ground line side is not being used to initialize the capacitor array 32, that is, if it is judged that the initialization switch 35 on the power supply line side is being used to initialize the capacitor array 32, the process proceeds to step S540 where it is judged whether or not the abnormality judging signal outputted from the comparator 42 is at the high level corresponding to the case of the input voltage of the comparator 4 being at the power supply voltage.

If it is judged at step S540 that the abnormality judging signal outputted from the comparator 42 is at the high level, since it means that the initialization switches 34, 35, and the ADC switch 28 are operating normally, this abnormality check process (P3) is terminated. On the other hand, if it is judged at step S540 that the abnormality judging signal outputted from the comparator 42 is not at the high level, the process proceeds to step S550 where it is determined there is abnormality in the initialization switches 34, 35, or the ADC switch 28, and the control section 40 outputs the ADC abnormality signal indicative of indicative of presence of abnormality to the CPU 50 before terminating the abnormality check process (P3).

As explained above, in the abnormality check process (P3), it is judged whether or not the charged voltage of the capacitor array 32 becomes equal to the expected voltage (ground voltage GND in the case of the initialization switch 34 being used, or the power supply voltage VDD in the case of the initialization switch 35 is being used), and if it is determined that charged voltage of the capacitor array 32 does not become equal to the expected voltage, the control section 40 outputs the ADC abnormality signal to the CPU 50 to inform indicative of presence of abnormality in the initialization switch 43, 45, or the ADC switch 28.

Hence, the A/D converter device 20 becomes able to detect abnormality not only in the multiplexer but also in the initialization switches 34, 35 and the ADC switch 28 to improve its self-diagnosis function, if it is configured to perform the abnormality check processes (P1), (P2), and (P3) by use of the control section 40.

Incidentally, to perform the abnormality check process (P3), the A/D converter device 20 has to be provided with the two kinds of the initialization switches (the initialization switch 34, and the initialization switch 35). However, in a case where the A/D converter device 20 is provided with only the initialization switch 34 on the ground line side, the A/D converter device 20 may be configured to perform only step S520 and step S530 of the abnormality check process (P3), and in a case where the A/D converter device 20 is provided with only the initialization switch 35 on the power supply line side, the A/D converter device 20 may be configured to perform only step S540 and step S550 of the abnormality check process (P3).

Fourth Variant

In the above described embodiments, the AD conversion result and the ADC abnormality signal outputted from the A/D converter device 20 to the CPU 50 are renewed in synchronization with the A/D conversion cycle. Since the period of the A/D conversion cycle is very short (10 ms, for example), if the CPU 50 monitors the ADC abnormality signal in synchronization with the A/D conversion cycle, the CPU 50 may be overloaded.

In addition, the ADC abnormality signal outputted from the A/D converter device 20 can temporarily deviate from its normal level indicative of no abnormality being present when the comparator 42 malfunctions due to noise. Accordingly, if the CPU 50 takes in the ADC abnormality signal outputted from the A/D converter device 20 in synchronization with the A/D conversion cycle, there is possibility that the CPU 50 erroneously performs the above described abnormality judging process.

To avoid this, in this variant, the ADC abnormality signal outputted from the A/D converter device 20 is inputted to a latch port provided in the CPU 50. And the CPU 50 monitors the latched signal in a cycle (every 4 ms, for example) longer than the A/D conversion cycle to suppress increase of its process load. Furthermore, only when the ADC abnormality signal at the level indicative of presence of abnormality has been latched a predetermined number of consecutive times (ten consecutive times, for example), the CPU 50 determines indicative of presence of abnormality in the A/D converter device 20, and thereafter the alarm lamp is lit to indicate this, reception of the detection signal from the A/D converter device 20 is stopped, and the fails-safe process is activated to safely stop the internal combustion engine.

Figure 13:
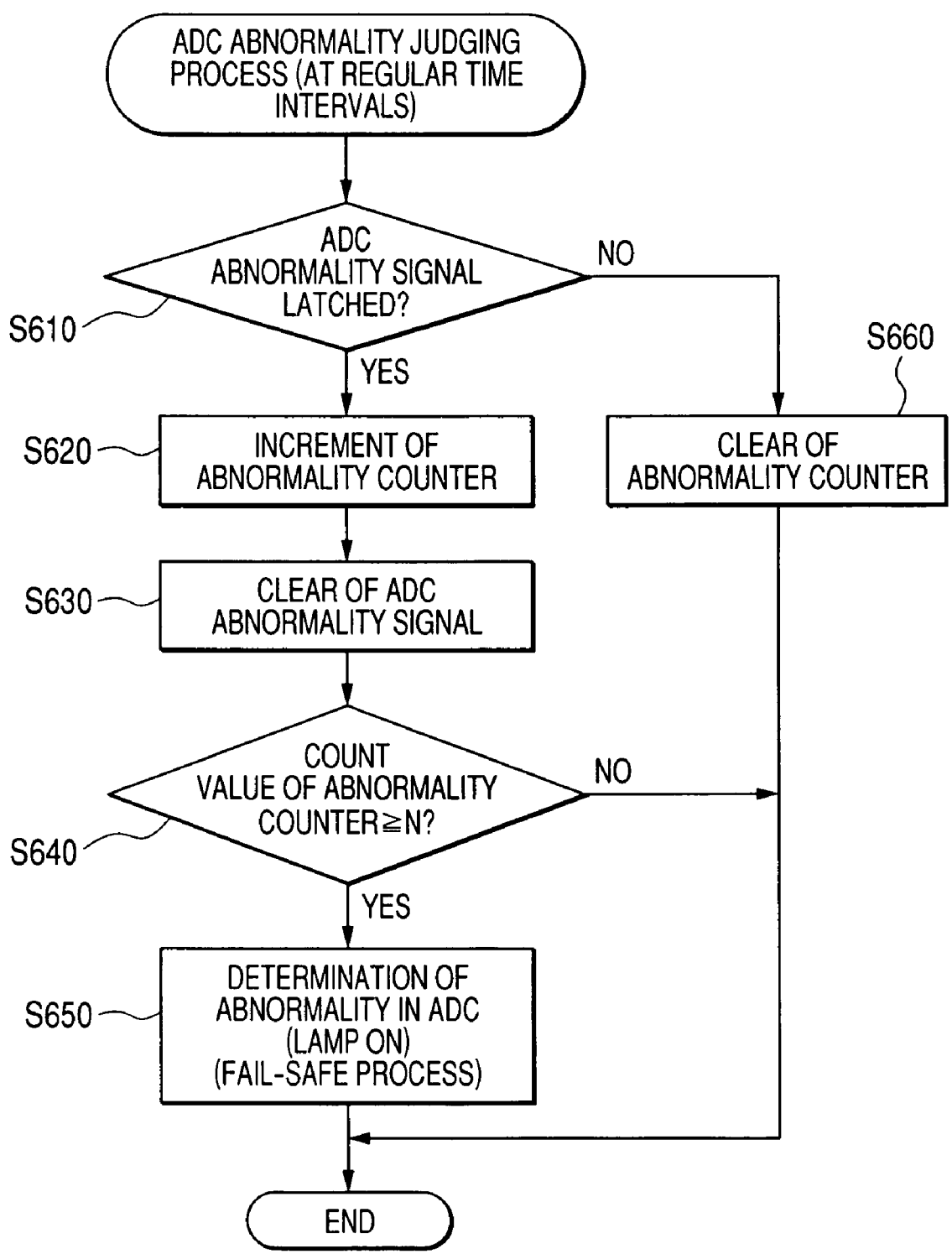
FIG. 13 is a flowchart showing an ADC abnormality judging process performed by a CPU of the engine ECU shown in FIG. 1

FIG. 13 is a flowchart showing the above described ADC abnormality judging process which the CPU 50 performs at a predetermined time intervals (every 4 ms, for example). This ADC abnormality judging process begins by judging at step S610 whether or not the ADC abnormality signal indicative of presence of abnormality is latched in the latch port. If it is judged that the ADC abnormality signal is not latched in the latch port, an abnormality counter is cleared at step S660, and then this process is terminated.

On the other hand, if it is judged at step S610 that the ADC abnormality signal is latched in the latch port, the process proceeds to step S620 to increment the abnormality counter by one, and then proceeds to step S630 to clear the ADC signal latched in the latch port.

As subsequent step S640, it is judged whether or not the count value of the abnormality counter has reached a predetermined value (10, for example). If it is judged that the count value of the abnormality counter has not reached the predetermined value, then this process is terminated. On the other hand, if it is judged that the count value of the abnormality counter has reached the predetermined value, the process proceeds to step S650 where it is determined that there is abnormality in the A/D converter device 20, and then the alarm lamp is lit to indicate this, reception of the detection signal from the A/D converter device 20 is stopped, and the fails-safe process is activated to safely stop the internal combustion engine, thereby terminating this process As explained above, by performing the ADC abnormality judging process shown in FIG. 13, the CPU 50 can suppress increase of its process load, and reliably detect indicative of presence of abnormality in the A/D converter device 20 without being affected by noise.

In the above described embodiments, the A/D converter device 20 and the CPU 50 are connected to each other by signal lines (bus) to individually send the A/D conversion result and the ADC abnormality signal from the A/D converter device 20 to the CPU 50 as shown in FIG. 1, however, they may be connected by a single communication line to send the A/D conversion result and the ADC abnormality signal from the A/D conversion device 20 to the CPU 50 through communication therebetween.

In this case, the CPU 50 may be so configured as to take in the ADC abnormality signal from the A/D converter device 20 each time the CPU 50 performs the ADC abnormality judging process shown in FIG. 13.

The above explained preferred embodiments are exemplary of the invention of the present application which is described solely by the claims appended below. It should be understood that modifications of the preferred embodiments may be made as would occur to one of skill in the art.

What is claimed is:

1. An A/D converter device comprising:

a plurality of input lines connected, through a pull-up resistor or a pull-down resistor, to a first power supply line selected from a positive-side power supply line connected to a positive side of a DC power source and a negative-side power supply line connected to a negative side of said DC power source;

a multiplexer having an input signal selection switch device for selecting, as an A/D conversion object, one of sensor signals outputted from external sensors each of which is connected to a corresponding one of said input lines, and delivering said A/D conversion object to a signal transfer line connected to said multiplexer;

a sample-hold section connected to said signal transfer line through an input switch device to hold therein said A/D conversion object;

an A/D converting section A/D converting said A/D conversion object held in said sample-hold section into digital data representing a signal level of said A/D conversion object;

an initialization switch device being turned on to connect a connection node between said input switch device and said sample-hold section to said first power supply line to initialize said sample-hold section; and an A/D conversion control section controlling said multiplexer such that said sensor signals are successively taken in as said A/D conversion object in a predetermined A/D conversion cycle, and alternately turning on and off said initialization switch device and said input switch device in synchronization with said A/D conversion cycle in order that initialization of said sample-hold section, sampling operation by said sample-hold section, and A/D converting operation by said A/D converting section are performed successively;

wherein said multiplexer is provided with a reference-voltage-selection switch device being turned on to apply reference voltage to said signal transfer line, and wherein said A/D converter device further comprises a comparing section comparing a voltage of said signal transfer line with a predetermined abnormality judging voltage, and an abnormality judging section configured to turn on said reference-voltage-selection switch device in order to apply said reference voltage to said signal transfer line in synchronization with said A/D conversion cycle on condition that said A/D converting operation by said A/D converting section is not interrupted, and to determine presence of abnormality in said A/D converter device if an comparison result of said comparing section does not match an expected value corresponding to said reference voltage when said reference-voltage-selection switch device is turned on.

2. The A/D converter device according to claim 1, wherein said abnormality judging section is configured to turn on said reference-voltage-selection switch device during a period in which said sample-hold section is not performing said sampling operation.

3. The A/D converter device according to claim 2, wherein said abnormality judging section is configured to turn on said reference-voltage-selection switch device during a period in which said A/D converting section is performing said A/D converting operation.

4. The A/D converter device according to claim 1, wherein said reference-voltage-selection switch device includes a first reference-voltage-selection switch being turned on to connect said positive-side power supply line to said signal transfer line, and a second reference-voltage-selection switch being turned on to connect said negative-side power supply line to said signal transfer line, and said abnormality judging section is configured to alternately turn on said first and second reference-voltage-selection switches in order to judge abnormality in said A/D converter device on the basis of a comparison result of said comparing section when said first reference-voltage-selection switch is turned on, and a comparison result of said comparing section when said second reference-voltage-selection switch is turned on.

5. The A/D converter device according to claim 4, wherein said first reference-voltage-selection switch is connected to said positive-side power supply line through a resistor at one terminal thereof, and connected to said signal transfer line at the other terminal thereof, and said second reference-voltage-selection switch is connected to said negative-side power supply line through a resistor at one terminal thereof, and connected to said signal transfer line at the other terminal thereof.

6. The A/D converter device according to claim 5, wherein said comparing section includes a first comparator for comparing a voltage of said signal transfer line connected to said positive-side power supply line through said first reference-voltage-selection switch with a first abnormality judging voltage, and a second comparator for comparing a voltage of said signal transfer line connected to said negative-side power supply line through said second reference-voltage-selection switch with a second abnormality judging voltage.

7. The A/D converter device according to claim 1, wherein said input switch device includes a first input switch and a second input switch connected in series to said signal transfer line, said first input switch being disposed on a side of said multiplexer, said second input switch being disposed on a side of said sample-hold section, said comparing section is configured to compare a voltage of said signal transfer line lying between said first switch and said second switch with said predetermined abnormality judging voltage, said A/D converting section is configured to turn off said first input switch and turn on said second switch during a period in which said sample-hold section is initialized, and to turn on both of said first and second input switches during a period in which said A/D conversion object is held in said sample hold-section, and said abnormality judging section is configured to take receive a comparison result of said comparing section during said period in which said sample-hold section is initialized without turning on said reference-voltage-selection switch, and to determine presence of abnormality in said A/D converter device if said received comparison result does not match an expected value corresponding to a voltage applied to said sample-hold section through said initializing switch device.

8. An electronic control apparatus for controlling control objects on the basis of sensor signals received from external sensors, comprising:

an A/D converter device including;

a plurality of input lines connected, through a pull-up resistor or a pull-down resistor, to a first power supply line selected from a positive-side power supply line connected to a positive side of a DC power source and a negative-side power supply line connected to a negative side of said DC power source, a multiplexer having an input signal selection switch device for selecting, as an A/D conversion object, one of sensor signals outputted from said external sensors each of which is connected to a corresponding one of said input lines, and delivering said A/D conversion object to a signal transfer line connected to said multiplexer, a sample-hold section connected to said signal transfer line through an input switch device to hold therein said A/D conversion object, an A/D converting section A/D converting said A/D conversion object held in said sample-hold section into digital data representing a signal level of said A/D conversion object, an initialization switch device being turned on to connect a connection node between said input switch device and said sample-hold section to said first power supply line to initialize said sample-hold section, and an A/D conversion control section controlling said multiplexer such that said sensor signals are successively taken in as said A/D conversion object in a predetermined A/D conversion cycle, and alternately turning on and off said initialization switch device and said input switch device in synchronization with said A/D conversion cycle in order that initialization of said sample-hold section, sampling operation by said sample-hold section, and A/D converting operation by said A/D converting section are performed successively, said multiplexer being provided with a reference-voltage-selection switch device being turned on to apply reference voltage to said signal transfer line, and said A/D converter device further comprising a comparing section comparing a voltage of said signal transfer line with a predetermined abnormality judging voltage, and an abnormality judging section configured to turn on said reference-voltage-selection switch device in order to apply said reference voltage to said signal transfer line in synchronization with said A/D conversion cycle on condition that said A/D converting operation by said A/D converting section is not interrupted, and to determine presence of abnormality in said A/D converter device if an comparison result of said comparing section does not match an expected value corresponding to said reference voltage when said reference-voltage-selection switch device is turned on;

an A/D conversion result judging section making a judgment as to whether or not said digital data received from said A/D converter device as an A/D conversion result is normal;

a device state judging section making a judgment as to whether or not said abnormality judging section of said A/D converter device determines presence of abnormality in said A/D converter device; and an abnormality content distinguishing section distinguishing between abnormality in said A/D converter device and abnormality in one of said external sensors on the basis of said judgment made by said A/D conversion result judging section and said judgment made by said device state judging section.

9. The electronic control apparatus according to claim 8, wherein said A/D conversion result judging section judges that said A/D conversion result is abnormal when said A/D conversion result is fixed at a maximum value thereof corresponding to a voltage of said positive-side power supply line or a minimum value thereof corresponding to a voltage of said negative-side power supply line, and said abnormality content distinguishing section is configured to judge that there is abnormality in said A/D converter device if said A/D conversion result judging section judges that said A/D conversion result is abnormal, and said device state judging section judges that said abnormality judging section of said A/D converter device judges determines presence of abnormality in said A/D converter device.

10. The electronic control apparatus according to claim 8, wherein aid A/D conversion result judging section judges that said A/D conversion result is abnormal when said A/D conversion result is fixed at a maximum value thereof corresponding to a voltage of said positive-side supply line or a minimum value thereof corresponding to a voltage of negative-side power supply line, and said abnormality content distinguishing section is configured to judge that there is abnormality in one of said external sensors relating to said A/D conversion result if said A/D conversion result judging section judges that said A/D conversion result is abnormal, and said device state judging section judges that said abnormality judging section of said A/D converter device determines presence of no abnormality in said A/D converter device.

11. The electronic control apparatus according to claim 10, wherein said connection node is connected to a second power supply line when said initialization switch device is turned on, said second power supply line being opposite in polarity to said first power supply line connected to one of said input lines through said pull-up resistor or said pull-down resistor, to which one of said external sensors is connected, and said abnormality content distinguishing section judges that there is breakage in said one of said external sensors if said device state judging section judges that said abnormality judging section of said A/D converter device determines presence of no abnormality in said A/D converter device, and said A/D conversion result judging section judges that said A/D conversion result is fixed at a value corresponding to a voltage of said first power supply line.

12. The electronic control apparatus according to claim 10, wherein said initialization switch device includes a first initialization switch for connecting said connection node to said first power supply line connected to one of said input lines through said pull-up resistor or said pull-down resistor, to which one of said external sensors is connected, and a second initialization switch for connecting said connection node to a second power supply line opposite in polarity to said first power supply line, said A/D conversion control section is configured to initialize said sample-hold section by use of one of said first initialization switch and said second first initialization switch when a sensor signal outputted from one of said external sensors is taken in by said multiplexer, said abnormality content judging section judges that there is breakage in said one of said external sensors if said device state judging section judges that said abnormality judging section determines presence of no abnormality in said A/D converter device, and said A/D conversion result judging section judges that said A/D conversion result is fixed at a value corresponding to a voltage of said first power supply line when said A/D conversion control section initializes said sample-hold section by use of said second initialization switch, said A/D conversion control section further initializes said sample-hold section by use of said first initialization switch, if said device state judging section judges that said abnormality judging section determines presence of no abnormality in said A/D converter device, and said A/D conversion result judging section judges that said A/D conversion result is fixed at a value corresponding to a voltage of said second power supply line after said A/D conversion control device initializes said sample-hold section by use of said second initialization switch, and said abnormality content judging section judges, when said A/D conversion control section further initializes said sample-hold section by use of said first initialization switch, that there is breakage in said input signal selection switch device of said multiplexer if said A/D conversion result judging section judges that said A/D conversion result is fixed at a value corresponding to said voltage of said first power supply line, and otherwise judges that there is abnormality in said one of said external sensors.

13. The electronic control apparatus according to claim 8, wherein one of said external sensors is an ion current detecting device detecting misfire of an internal combustion engine by detecting an ion current flowing between opposing electrodes of a spark plug of said internal combustion engine after completion of spark discharge produced by said spark plug, and outputting an ion current detection signal indicative of a value of said ion current, and said electronic control apparatus further comprises a over-threshold time measuring section measuring, over a predetermined time period after said spark plug produces spark plug, a length of time during which a value of said ion current exceeds a predetermined abnormality judging threshold on the basis of an A/D conversion result of said ion current detection signal received from said ion current detecting device through said A/D converter device, and judging that said A/D conversion result of said ion current detection signal is abnormal if said measured length of said time is outside an allowable range between a predetermined lower limit time and a predetermined upper limit time.

14. The electronic control apparatus according to claim 13, wherein said abnormality content distinguishing section determines that there is abnormality in said A/D converter device if said over-threshold time measuring section judges that said measured length of said time is outside said allowable range, and said device state judging means judges that said abnormality judging section determines presence of abnormality in said A/D converter device.

15. The electronic control apparatus according to claim 13, wherein said abnormality content distinguishing section determines that there is abnormality in said ion current detecting device if said over-threshold time measuring section judges that said measured length of said time is outside said allowable range, and said device state judging means judges that said abnormality judging section determines presence of abnormality in said A/D converter device.

16. The electronic control apparatus according to claim 15, wherein said connection node is connected to a second power supply line when said initialization switch device is turned on, said second power supply line being opposite in polarity to said first power supply line connected to one of said input lines through said pull-up resistor or said pull-down resistor, to which said ion current detecting device is connected, and said abnormality content distinguishing section judges that there is breakage in said ion current detecting device if said device state judging section judges that said abnormality judging section determines presence of no abnormality in said A/D converter device, and said over-threshold time measuring section judges that said measured length of said time is shorter than said lower limit time.

17. The electronic control apparatus according to claim 15, wherein said initialization switch device includes a first initialization switch for connecting said connection node to said first power supply line connected to one of said input lines through said pull-up resistor or said pull-down resistor, to which said ion current detecting device is connected, and a second initialization switch for connecting said connection node to said second power supply line opposite in polarity to said first power supply line, said A/D conversion control section is configured to initialize said sample-hold section by use of one of said first initialization switch and said second initialization switch when a sensor signal outputted from one of said external sensors is taken in by said multiplexer, said abnormality content distinguishing section judges that there is breakage in said ion current detecting device if said device state judging section judges that said abnormality judging section determines presence of no abnormality in said A/D converter device, and said over-threshold time measuring section judges that said measured length of time is shorter than said lower limit time when said A/D conversion control section initializes said sample-hold section by use of said second initialization switch, said A/D conversion control section further initializes said sample-hold section by use of said first initialization switch, if said device state judging section judges that said abnormality judging section determines presence of no abnormality in said A/D converter device, and said over-threshold time measuring section judges that said measured length of said time is longer than said upper limit time after said A/D conversion control section initializes said sample-hold section by use of said second initialization switch, said abnormality content distinguishing section judges, when said sample-hold section is further initialized by use of said first initialization switch, that there is breakage in said input signal selection switch device of said multiplexer if said over-threshold time measuring section judges that said measured length of said time is shorter than said lower limit time, and otherwise judges that there is abnormality in said ion-current detecting device.

18. The electronic control apparatus according to claim 17, wherein said A/D conversion control section makes a change between said first initialization switch and said second initialization switch to be used for initializing said sample-hold section when said A/D converter device is powered on, and thereafter uses the same one of the first initialization switch and said second initialization switch.

19. The electronic control apparatus according to claim 8, wherein said device state judging section determines that there is abnormality in said A/D converter device if a number of times that said abnormality judging section of said A/D converter device judges that there is abnormality in said A/D converter device.

* * * * *